United States Patent
Tseng et al.

(10) Patent No.: US 12,160,034 B2
(45) Date of Patent: *Dec. 3, 2024

(54) ANTENNA STRUCTURES AND ANTENNA ASSEMBLIES THAT INCORPORATE THE ANTENNA STRUCTURES

(71) Applicant: Taoglas Group Holdings Limited, Enniscorthy (IE)

(72) Inventors: Adam Tseng, Tainan (TW); Buluto Wu, Tainan (TW); Andy Yang, Tainan (TW)

(73) Assignee: Taoglas Group Holdings Limited, Enniscorthy (IE)

(*) Notice: Subject to any disclaimer, the term of this patent is extended or adjusted under 35 U.S.C. 154(b) by 0 days.

This patent is subject to a terminal disclaimer.

(21) Appl. No.: 18/235,858

(22) Filed: Aug. 20, 2023

(65) Prior Publication Data
US 2024/0088548 A1    Mar. 14, 2024

Related U.S. Application Data

(63) Continuation of application No. 17/317,230, filed on May 11, 2021, now Pat. No. 11,735,813.
(Continued)

(51) Int. Cl.
*H01Q 1/36* (2006.01)
*H01Q 1/48* (2006.01)
(Continued)

(52) U.S. Cl.
CPC ............ *H01Q 1/36* (2013.01); *H01Q 1/48* (2013.01); *H03H 1/00* (2013.01); *H01Q 5/25* (2015.01)

(58) Field of Classification Search
None
See application file for complete search history.

(56) References Cited

U.S. PATENT DOCUMENTS 6,323,811 B1 * 11/2001 Tsubaki ............... H01Q 19/005
343/702
6,965,346 B2 * 11/2005 Sung .................... H01Q 1/24
343/702
(Continued)

FOREIGN PATENT DOCUMENTS

| EP | 2395602 | 12/2011 |
| JP | H09139621 | 5/1997 |
| WO | 2014058926 | 4/2014 |

*Primary Examiner* — Dameon E Levi
*Assistant Examiner* — Anh H Ho
(74) *Attorney, Agent, or Firm* — Garson & Gutierrez, PC

(57) ABSTRACT

Antenna structures as well as antenna assemblies that incorporate the aforementioned antenna structures. In one embodiment, the antenna structure includes a substrate having a first major face, a second major face, and a side face. The first major face may include a first laterally extending conductive structure extending along a first edge of the first major face of the substrate and a pronged conductive structure having a first prong extending from a portion of the laterally extending conductive structure towards a first corner of the substrate and a second prong extending from a portion of the laterally extending conductive structure towards a second corner of the substrate. The second major face includes a second laterally extending conductive structure with a conductive structure placing the conductive structures on the first major face in electrical communication with the conductive structures on the second major face.

20 Claims, 22 Drawing Sheets

Related U.S. Application Data

(60) Provisional application No. 63/025,746, filed on May 15, 2020, provisional application No. 63/024,922, filed on May 14, 2020.

(51) Int. Cl.
*H01Q 5/25* (2015.01)
*H03H 1/00* (2006.01)

(56) References Cited

U.S. PATENT DOCUMENTS

| | | | |
|---|---|---|---|
| 2002/0101382 A1* | 8/2002 | Konishi | H01Q 1/362 343/702 |
| 2003/0132883 A1* | 7/2003 | Wong | H01Q 5/371 343/702 |
| 2009/0051597 A1* | 2/2009 | Wen | H01Q 1/38 343/700 MS |
| 2010/0013732 A1 | 1/2010 | Kapuliansky et al. | |
| 2010/0231464 A1* | 9/2010 | Huang | H01Q 15/0086 343/702 |
| 2011/0309993 A1* | 12/2011 | He | H01Q 1/38 343/860 |
| 2013/0256850 A1 | 10/2013 | Danny et al. | |

* cited by examiner

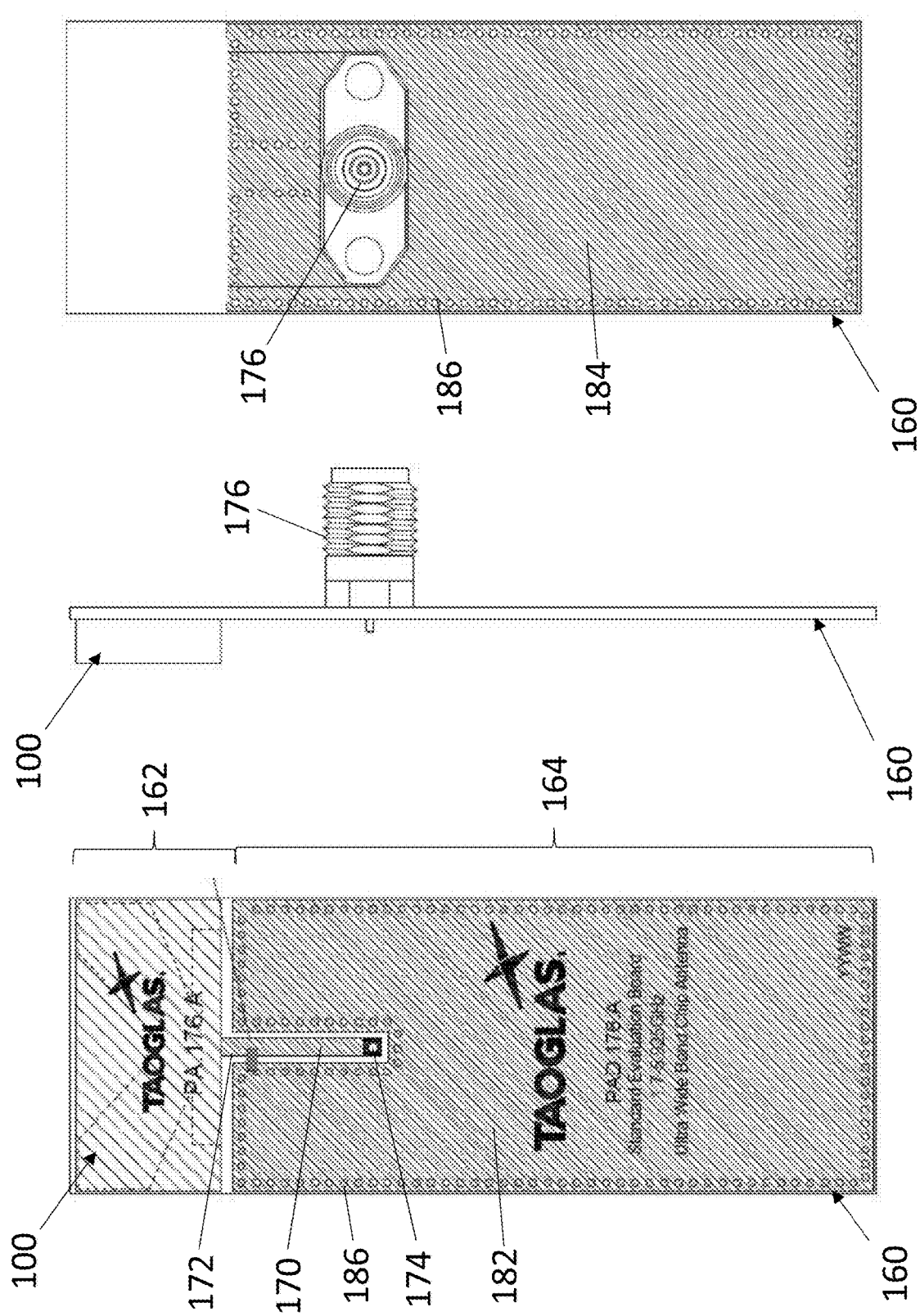

|  | | DCS 1710~1880 | PCS 1850~1990 | UMTS1 1920~2170 | LTE 2600 2300~2690 | 5GNR B77~79 3300~3500 | UWB US1~4 3200~4650 | LTE 5200 5150~5925 |
|---|---|---|---|---|---|---|---|---|
| Efficiency avg. for the freq. band | 55mm | 53.22 | 59.84 | 64.10 | 64.14 | 57.16 | 56.45 | 53.64 |
|  | 55mm_Matching | 70.48 | 70.02 | 71.83 | 69.06 | 56.40 | 57.78 | 63.22 |
| Avg. Gain avg. for the freq. band | 55mm | -2.75 | -2.23 | -1.94 | -1.94 | -2.43 | -2.49 | -2.78 |
|  | 55mm_Matching | -1.52 | -1.55 | -1.44 | -1.62 | -2.49 | -2.39 | -2.06 |
| Peak Gain for Gtotal | 55mm | 1.43 | 2.00 | 2.61 | 2.91 | 4.27 | 3.78 | 2.45 |
|  | 55mm_Matching | 3.00 | 3.35 | 3.85 | 4.49 | 3.73 | 3.59 | 2.79 |
| Maximum Return Loss for the freq. band | 55mm | -3.03 | -5.08 | -6.43 | -10.55 | -15.90 | -7.45 | -6.10 |
|  | 55mm_Matching | -6.05 | -7.77 | -9.45 | -15.65 | -17.93 | -8.71 | -6.10 |

FIG. 5

| | | DCS 1710-1880 | PCS 1850-1990 | UMTS1 1920-2170 | LTE2600 2300-2690 | 5GNR B77-79 3300-3500 | UWB US1-4 3200-4650 | LTE 5200 5150-5925 |
|---|---|---|---|---|---|---|---|---|
| Efficiency avg. for the freq. band | 30mm | 32.42 | 37.24 | 42.27 | 45.81 | 50.41 | 52.25 | 56.72 |
| | 40mm | 40.89 | 45.72 | 50.62 | 60.88 | 63.29 | 63.35 | 61.12 |
| | 50mm | 53.82 | 56.96 | 60.74 | 65.15 | 53.71 | 54.40 | 61.48 |
| | 55mm | 70.48 | 70.02 | 71.83 | 69.06 | 56.40 | 57.78 | 63.22 |
| | 60mm | 77.03 | 72.35 | 72.08 | 65.65 | 55.76 | 58.12 | 64.82 |
| | 65mm | 74.85 | 65.71 | 64.88 | 54.15 | 49.22 | 52.00 | 56.16 |
| Avg. Gain avg. for the freq. band | 30mm | -4.89 | -4.30 | -3.75 | -3.39 | -2.98 | -2.84 | -2.53 |
| | 40mm | -3.89 | -3.40 | -2.97 | -2.16 | -1.99 | -1.99 | -2.21 |
| | 50mm | -2.69 | -2.45 | -2.17 | -1.87 | -2.70 | -2.65 | -2.18 |
| | 55mm | -1.52 | -1.55 | -1.44 | -1.62 | -2.49 | -2.39 | -2.06 |
| | 60mm | -1.13 | -1.41 | -1.43 | -1.84 | -2.54 | -2.37 | -1.92 |
| | 65mm | -1.27 | -1.83 | -1.88 | -2.68 | -3.08 | -2.86 | -2.60 |
| Peak Gain for Gtotal | 30mm | -0.27 | 0.88 | 1.68 | 2.72 | 1.86 | 2.00 | 3.19 |
| | 40mm | 0.61 | 1.47 | 2.27 | 3.30 | 1.89 | 2.37 | 3.57 |
| | 50mm | 1.91 | 2.48 | 3.05 | 3.88 | 2.16 | 2.71 | 3.17 |
| | 55mm | 3.00 | 3.35 | 3.85 | 4.49 | 3.73 | 3.59 | 2.79 |
| | 60mm | 3.00 | 3.03 | 3.45 | 3.83 | 3.37 | 3.14 | 2.97 |
| | 65mm | 3.34 | 3.33 | 3.74 | 3.65 | 3.30 | 3.04 | 2.87 |

FIG. 6

| | DCS 1710~1880 | PCS 1850~1990 | UMTS1 1920~2170 | LTE 2600 2300~2690 | 5GNR B77-79 3300~3500 | UWB US1-4 3200~4650 | LTE 5200 5150~5925 |
|---|---|---|---|---|---|---|---|
| 30mm | -4.61 | -5.58 | -5.78 | -7.42 | -11.31 | -10.28 | -5.74 |
| 40mm | -4.23 | -4.88 | -5.29 | -7.07 | -16.16 | -12.77 | -6.32 |
| 50mm | -4.68 | -5.79 | -6.60 | -11.22 | -22.51 | -8.15 | -6.32 |
| 55mm | -6.05 | -7.77 | -9.45 | -15.65 | -17.93 | -8.71 | -6.10 |
| 60mm | -7.39 | -9.77 | -11.49 | -13.96 | -15.38 | -9.98 | -8.11 |
| 65mm | -9.93 | -12.09 | -13.24 | -12.30 | -14.88 | -11.63 | -5.91 |
| Maximum Return Loss for the freq. band | | | | | | | |

FIG. 7

| 55mm | Max | Mean | Min |
|---|---|---|---|
| DCS 1710~1880 | -3.0 | -4.3 | -5.6 |
| PCS 1850~1990 | -5.1 | -6.3 | -7.6 |
| UMTS1 1920~2170 | -6.4 | -8.4 | -10.6 |
| LTE 2600 2300~2690 | -10.6 | -12.8 | -15.1 |
| 5GNR B77~79 3300~3500 | -15.9 | -18.0 | -19.1 |
| UWB US1~4 3200~4650 | -7.5 | -11.6 | -20.2 |
| LTE 5200 5150~5925 | -6.1 | -9.0 | -14.5 |

| 55mm_Matching | Max | Mean | Min |
|---|---|---|---|
| DCS 1710~1880 | -6.1 | -7.2 | -8.6 |
| PCS 1850~1990 | -7.8 | -9.4 | -10.8 |
| UMTS1 1920~2170 | -9.4 | -11.7 | -13.1 |
| LTE 2600 2300~2690 | -15.6 | -17.2 | -19.0 |
| 5GNR B77~79 3300~3500 | -17.9 | -21.1 | -22.7 |
| UWB US1~4 3200~4650 | -8.7 | -13.1 | -22.7 |
| LTE 5200 5150~5925 | -6.1 | -9.8 | -11.0 |

40mm

| | Max | Mean | Min |
|---|---|---|---|
| DCS 1710~1880 | -4.6 | -5.2 | -5.7 |
| PCS 1850~1990 | -5.6 | -5.9 | -6.2 |
| UMTS1 1920~2170 | -5.8 | -6.4 | -7.1 |
| LTE 2600 2300~2690 | -7.4 | -8.1 | -8.9 |
| 5GNR B77~79 3300~3500 | -11.3 | -12.3 | -13.1 |
| UWB US1~4 3200~4650 | -10.3 | -11.0 | -13.1 |
| LTE 5200 5150~5925 | -5.7 | -10.7 | -11.9 |

50mm

| | Max | Mean | Min |
|---|---|---|---|
| DCS 1710~1880 | -4.2 | -4.7 | -5.2 |
| PCS 1850~1990 | -4.9 | -5.3 | -5.6 |
| UMTS1 1920~2170 | -5.3 | -5.9 | -6.6 |
| LTE 2600 2300~2690 | -7.1 | -8.4 | -9.7 |
| 5GNR B77~79 3300~3500 | -16.2 | -18.1 | -20.3 |
| UWB US1~4 3200~4650 | -12.8 | -19.5 | -25.5 |
| LTE 5200 5150~5925 | -6.3 | -7.8 | -10.4 |

55mm

| | Max | Mean | Min |
|---|---|---|---|
| DCS 1710~1880 | -6.1 | -7.2 | -8.6 |
| PCS 1850~1990 | -7.8 | -9.4 | -10.8 |
| UMTS1 1920~2170 | -9.4 | -11.7 | -13.1 |
| LTE 2600 2300~2690 | -15.6 | -17.2 | -19.0 |
| 5GNR B77~79 3300~3500 | -17.9 | -21.1 | -22.7 |
| UWB US1~4 3200~4650 | -8.7 | -13.1 | -22.7 |
| LTE 5200 5150~5925 | -6.1 | -9.8 | -11.0 |

60mm

| | Max | Mean | Min |
|---|---|---|---|
| DCS 1710~1880 | -7.4 | -9.2 | -10.5 |
| PCS 1850~1990 | -9.8 | -11.2 | -11.9 |
| UMTS1 1920~2170 | -11.5 | -13.3 | -15.6 |
| LTE 2600 2300~2690 | -14.0 | -15.3 | -16.7 |
| 5GNR B77~79 3300~3500 | -15.4 | -17.1 | -18.3 |
| UWB US1~4 3200~4650 | -10.0 | -12.3 | -18.3 |
| LTE 5200 5150~5925 | -8.1 | -8.9 | -10.2 |

65mm

| | Max | Mean | Min |
|---|---|---|---|
| DCS 1710~1880 | -9.9 | -11.3 | -12.8 |
| PCS 1850~1990 | -12.1 | -13.2 | -13.7 |
| UMTS1 1920~2170 | -13.2 | -13.9 | -15.0 |
| LTE 2600 2300~2690 | -12.3 | -12.9 | -13.7 |
| 5GNR B77~79 3300~3500 | -14.9 | -15.7 | -16.3 |
| UWB US1~4 3200~4650 | -11.6 | -13.4 | -16.3 |
| LTE 5200 5150~5925 | -5.9 | -8.2 | -11.0 |

FIG. 9B

| 30mm | Max | Mean | Min | 55mm | Max | Mean | Min |
|---|---|---|---|---|---|---|---|
| DCS 1710~1880 | 35.1% | 32.4% | 31.1% | DCS 1710~1880 | 73.0% | 70.5% | 68.5% |
| PCS 1850~1990 | 41.8% | 37.2% | 32.2% | PCS 1850~1990 | 72.4% | 70.0% | 66.3% |
| UMTS1 1920~2170 | 48.5% | 42.3% | 37.5% | UMTS1 1920~2170 | 77.6% | 71.8% | 66.3% |
| LTE 2600 2300~2690 | 50.6% | 45.8% | 42.5% | LTE 2600 2300~2690 | 77.2% | 69.1% | 62.1% |
| 5GNR B77~79 3300~3500 | 51.0% | 50.4% | 49.8% | 5GNR B77~79 3300~3500 | 56.9% | 56.4% | 55.9% |
| UWB US1~4 3200~4650 | 63.8% | 52.3% | 46.8% | UWB US1~4 3200~4650 | 67.6% | 57.8% | 52.0% |
| LTE 5200 5150~5925 | 69.8% | 56.7% | 28.4% | LTE 5200 5150~5925 | 78.8% | 63.2% | 32.2% |
| 40mm | Max | Mean | Min | 60mm | Max | Mean | Min |
| DCS 1710~1880 | 44.3% | 40.9% | 39.4% | DCS 1710~1880 | 80.5% | 77.0% | 73.2% |
| PCS 1850~1990 | 49.6% | 45.7% | 41.0% | PCS 1850~1990 | 75.1% | 72.4% | 67.6% |
| UMTS1 1920~2170 | 56.5% | 50.6% | 45.9% | UMTS1 1920~2170 | 78.0% | 72.1% | 67.6% |
| LTE 2600 2300~2690 | 67.5% | 60.9% | 56.5% | LTE 2600 2300~2690 | 74.5% | 65.6% | 58.5% |
| 5GNR B77~79 3300~3500 | 64.1% | 63.3% | 62.5% | 5GNR B77~79 3300~3500 | 56.8% | 55.8% | 54.3% |
| UWB US1~4 3200~4650 | 77.0% | 63.4% | 57.3% | UWB US1~4 3200~4650 | 70.4% | 58.1% | 52.2% |
| LTE 5200 5150~5925 | 79.4% | 61.1% | 32.4% | LTE 5200 5150~5925 | 79.4% | 64.8% | 48.4% |
| 50mm | Max | Mean | Min | 65mm | Max | Mean | Min |
| DCS 1710~1880 | 57.4% | 53.8% | 51.1% | DCS 1710~1880 | 79.1% | 74.8% | 67.4% |
| PCS 1850~1990 | 59.2% | 57.0% | 54.3% | PCS 1850~1990 | 67.6% | 65.7% | 61.7% |
| UMTS1 1920~2170 | 66.5% | 60.7% | 55.0% | UMTS1 1920~2170 | 70.7% | 64.9% | 61.7% |
| LTE 2600 2300~2690 | 71.4% | 65.2% | 59.2% | LTE 2600 2300~2690 | 63.9% | 54.1% | 48.1% |
| 5GNR B77~79 3300~3500 | 54.5% | 53.7% | 52.5% | 5GNR B77~79 3300~3500 | 51.0% | 49.2% | 47.4% |
| UWB US1~4 3200~4650 | 64.7% | 54.4% | 49.3% | UWB US1~4 3200~4650 | 65.6% | 52.0% | 46.2% |
| LTE 5200 5150~5925 | 76.8% | 61.5% | 34.3% | LTE 5200 5150~5925 | 72.7% | 56.2% | 24.5% |

FIG. 11B

| 30mm | Max | Mean | Min | 55mm | Max | Mean | Min |
|---|---|---|---|---|---|---|---|
| DCS 1710~1880 | -4.6 dB | -4.9 dB | -5.1 dB | DCS 1710~1880 | -1.4 dB | -1.5 dB | -1.6 dB |
| PCS 1850~1990 | -3.8 dB | -4.3 dB | -4.9 dB | PCS 1850~1990 | -1.4 dB | -1.5 dB | -1.8 dB |
| UMTS1 1920~2170 | -3.1 dB | -3.8 dB | -4.3 dB | UMTS1 1920~2170 | -1.1 dB | -1.4 dB | -1.8 dB |
| LTE 2600 2300~2690 | -3.0 dB | -3.4 dB | -3.7 dB | LTE 2600 2300~2690 | -1.1 dB | -1.6 dB | -2.1 dB |
| 5GNR B77~79 3300~3500 | -2.9 dB | -3.0 dB | -3.0 dB | 5GNR B77~79 3300~3500 | -2.4 dB | -2.5 dB | -2.5 dB |
| UWB US1~4 3200~4650 | -2.0 dB | -2.8 dB | -3.3 dB | UWB US1~4 3200~4650 | -1.7 dB | -2.4 dB | -2.8 dB |
| LTE 5200 5150~5925 | -1.6 dB | -2.5 dB | -5.5 dB | LTE 5200 5150~5925 | -1.0 dB | -2.1 dB | -4.9 dB |
| 40mm | Max | Mean | Min | 60mm | Max | Mean | Min |
| DCS 1710~1880 | -3.5 dB | -3.9 dB | -4.0 dB | DCS 1710~1880 | -0.9 dB | -1.1 dB | -1.4 dB |
| PCS 1850~1990 | -3.0 dB | -3.4 dB | -3.9 dB | PCS 1850~1990 | -1.2 dB | -1.4 dB | -1.7 dB |
| UMTS1 1920~2170 | -2.5 dB | -3.0 dB | -3.4 dB | UMTS1 1920~2170 | -1.1 dB | -1.4 dB | -1.7 dB |
| LTE 2600 2300~2690 | -1.7 dB | -2.2 dB | -2.5 dB | LTE 2600 2300~2690 | -1.3 dB | -1.8 dB | -2.3 dB |
| 5GNR B77~79 3300~3500 | -1.9 dB | -2.0 dB | -2.0 dB | 5GNR B77~79 3300~3500 | -2.5 dB | -2.5 dB | -2.7 dB |
| UWB US1~4 3200~4650 | -1.1 dB | -2.0 dB | -2.4 dB | UWB US1~4 3200~4650 | -1.5 dB | -2.4 dB | -2.8 dB |
| LTE 5200 5150~5925 | -1.0 dB | -2.2 dB | -4.9 dB | LTE 5200 5150~5925 | -1.0 dB | -1.9 dB | -3.1 dB |
| 50mm | Max | Mean | Min | 65mm | Max | Mean | Min |
| DCS 1710~1880 | -2.4 dB | -2.7 dB | -2.9 dB | DCS 1710~1880 | -1.0 dB | -1.3 dB | -1.7 dB |
| PCS 1850~1990 | -2.3 dB | -2.4 dB | -2.6 dB | PCS 1850~1990 | -1.7 dB | -1.8 dB | -2.1 dB |
| UMTS1 1920~2170 | -1.8 dB | -2.2 dB | -2.6 dB | UMTS1 1920~2170 | -1.5 dB | -1.9 dB | -2.1 dB |
| LTE 2600 2300~2690 | -1.5 dB | -1.9 dB | -2.3 dB | LTE 2600 2300~2690 | -1.9 dB | -2.7 dB | -3.2 dB |
| 5GNR B77~79 3300~3500 | -2.6 dB | -2.7 dB | -2.8 dB | 5GNR B77~79 3300~3500 | -2.9 dB | -3.1 dB | -3.2 dB |
| UWB US1~4 3200~4650 | -1.9 dB | -2.7 dB | -3.1 dB | UWB US1~4 3200~4650 | -1.8 dB | -2.9 dB | -3.4 dB |
| LTE 5200 5150~5925 | -1.1 dB | -2.2 dB | -4.6 dB | LTE 5200 5150~5925 | -1.4 dB | -2.6 dB | -6.1 dB |

| Band | Max | Mean | Min |
|---|---|---|---|
| DCS 1710~1880 | 0.5 dBi | -0.3 dBi | -0.6 dBi |
| PCS 1850~1990 | 1.5 dBi | 0.9 dBi | -0.0 dBi |
| UMTS1 1920~2170 | 2.3 dBi | 1.7 dBi | 1.0 dBi |
| LTE 2600 2300~2690 | 3.2 dBi | 2.7 dBi | 2.4 dBi |
| 5GNR B77~79 3300~3500 | 2.0 dBi | 1.9 dBi | 1.8 dBi |
| UWB US1~4 3200~4650 | 3.4 dBi | 2.0 dBi | 1.5 dBi |
| LTE 5200 5150~5925 | 4.8 dBi | 3.2 dBi | -0.1 dBi |

40mm

| Band | Max | Mean | Min |
|---|---|---|---|
| DCS 1710~1880 | 1.2 dBi | 0.6 dBi | 0.4 dBi |
| PCS 1850~1990 | 2.2 dBi | 1.5 dBi | 0.8 dBi |
| UMTS1 1920~2170 | 2.9 dBi | 2.3 dBi | 1.5 dBi |
| LTE 2600 2300~2690 | 3.9 dBi | 3.3 dBi | 2.9 dBi |
| 5GNR B77~79 3300~3500 | 2.0 dBi | 1.9 dBi | 1.7 dBi |
| UWB US1~4 3200~4650 | 3.9 dBi | 2.4 dBi | 1.7 dBi |
| LTE 5200 5150~5925 | 4.9 dBi | 3.6 dBi | -0.6 dBi |

50mm

| Band | Max | Mean | Min |
|---|---|---|---|
| DCS 1710~1880 | 2.4 dBi | 1.9 dBi | 1.7 dBi |
| PCS 1850~1990 | 2.9 dBi | 2.5 dBi | 2.0 dBi |
| UMTS1 1920~2170 | 3.5 dBi | 3.1 dBi | 2.5 dBi |
| LTE 2600 2300~2690 | 4.4 dBi | 3.9 dBi | 3.5 dBi |
| 5GNR B77~79 3300~3500 | 2.4 dBi | 2.2 dBi | 2.1 dBi |
| UWB US1~4 3200~4650 | 3.9 dBi | 2.7 dBi | 2.1 dBi |
| LTE 5200 5150~5925 | 4.3 dBi | 3.2 dBi | -1.1 dBi |

55mm

| Band | Max | Mean | Min |
|---|---|---|---|
| DCS 1710~1880 | 3.2 dBi | 3.0 dBi | 2.9 dBi |
| PCS 1850~1990 | 3.8 dBi | 3.4 dBi | 2.9 dBi |
| UMTS1 1920~2170 | 4.3 dBi | 3.9 dBi | 3.4 dBi |
| LTE 2600 2300~2690 | 4.9 dBi | 4.5 dBi | 4.2 dBi |
| 5GNR B77~79 3300~3500 | 3.8 dBi | 3.7 dBi | 3.6 dBi |
| UWB US1~4 3200~4650 | 4.4 dBi | 3.6 dBi | 3.1 dBi |
| LTE 5200 5150~5925 | 4.2 dBi | 2.8 dBi | -0.8 dBi |

60mm

| Band | Max | Mean | Min |
|---|---|---|---|
| DCS 1710~1880 | 3.2 dBi | 3.0 dBi | 2.8 dBi |
| PCS 1850~1990 | 3.3 dBi | 3.0 dBi | 2.8 dBi |
| UMTS1 1920~2170 | 4.0 dBi | 3.5 dBi | 3.0 dBi |
| LTE 2600 2300~2690 | 4.4 dBi | 3.8 dBi | 3.5 dBi |
| 5GNR B77~79 3300~3500 | 3.5 dBi | 3.4 dBi | 3.3 dBi |
| UWB US1~4 3200~4650 | 4.2 dBi | 3.1 dBi | 2.4 dBi |
| LTE 5200 5150~5925 | 4.1 dBi | 3.0 dBi | 1.0 dBi |

65mm

| Band | Max | Mean | Min |
|---|---|---|---|
| DCS 1710~1880 | 3.6 dBi | 3.3 dBi | 3.0 dBi |
| PCS 1850~1990 | 3.7 dBi | 3.3 dBi | 3.0 dBi |
| UMTS1 1920~2170 | 4.2 dBi | 3.7 dBi | 3.3 dBi |
| LTE 2600 2300~2690 | 4.3 dBi | 3.7 dBi | 3.2 dBi |
| 5GNR B77~79 3300~3500 | 3.5 dBi | 3.3 dBi | 3.1 dBi |
| UWB US1~4 3200~4650 | 4.2 dBi | 3.0 dBi | 2.3 dBi |
| LTE 5200 5150~5925 | 4.4 dBi | 2.9 dBi | -1.2 dBi |

FIG. 15B

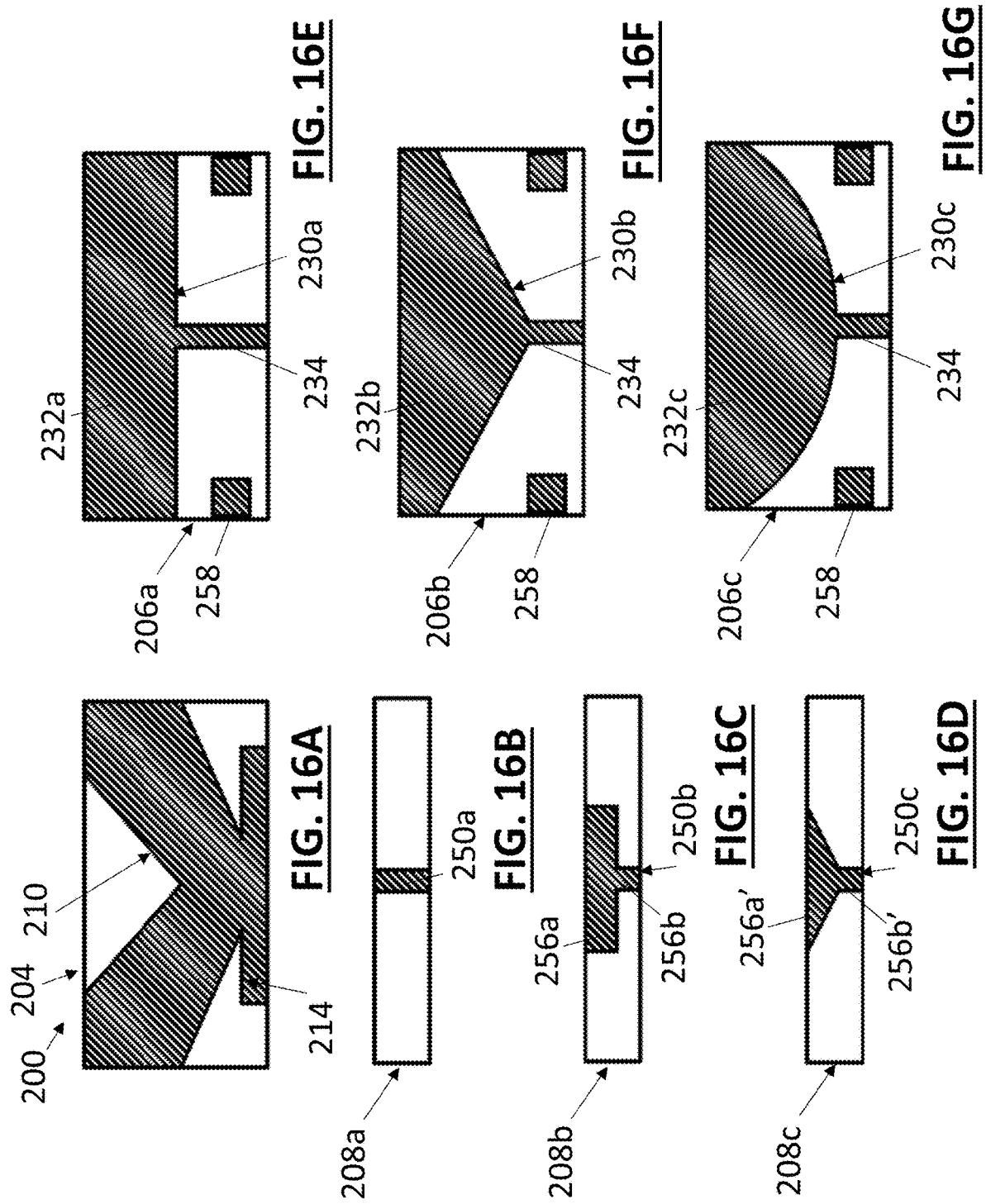

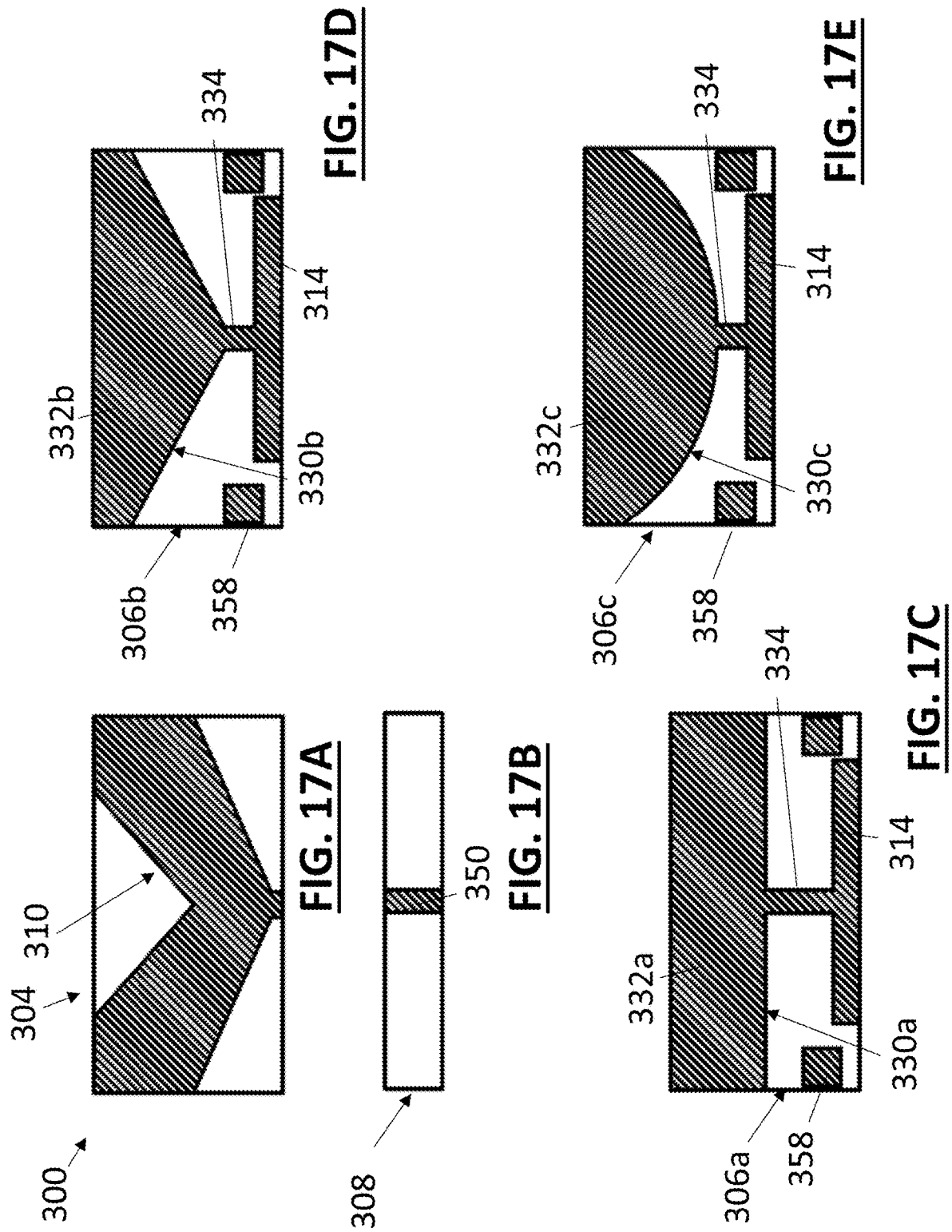

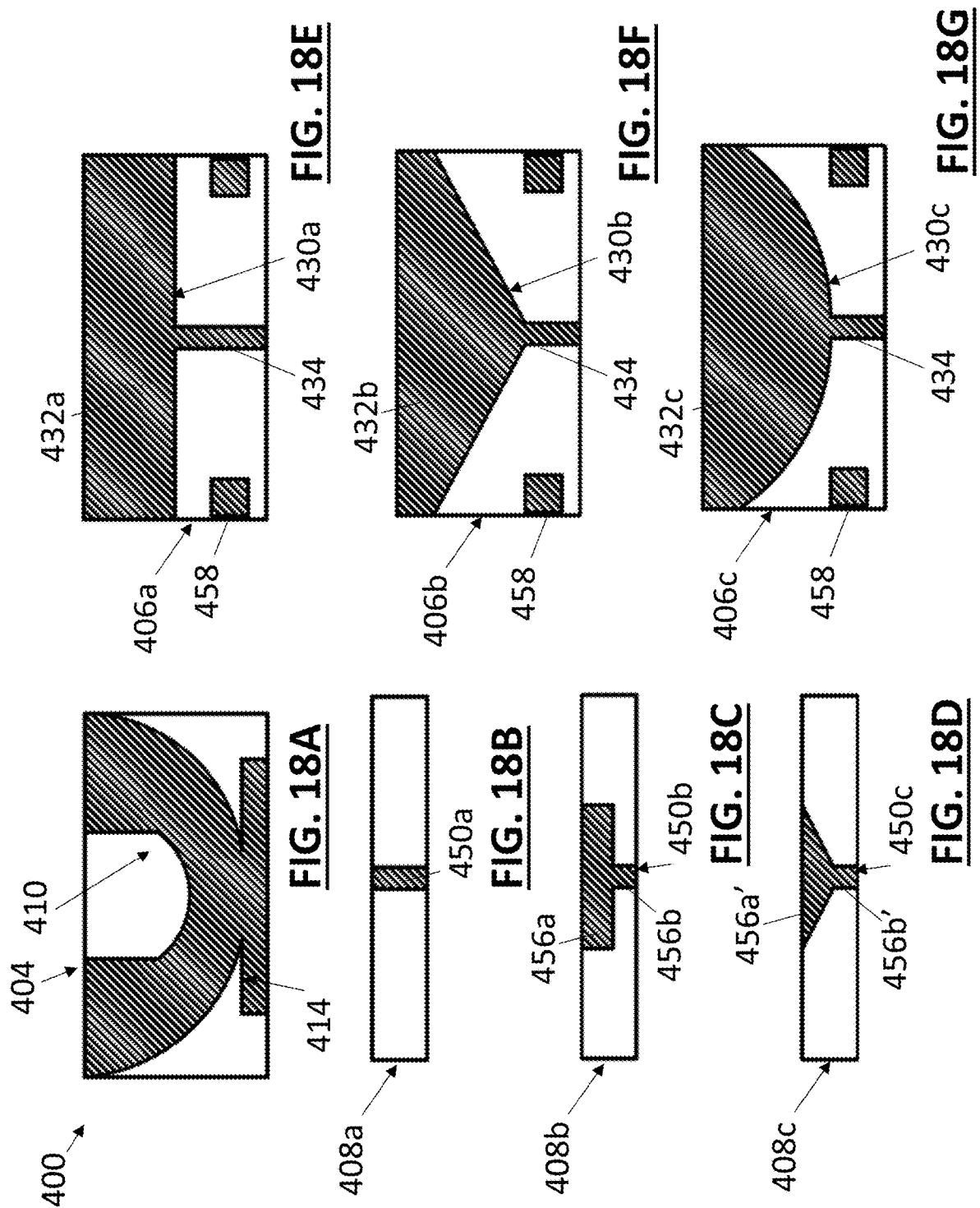

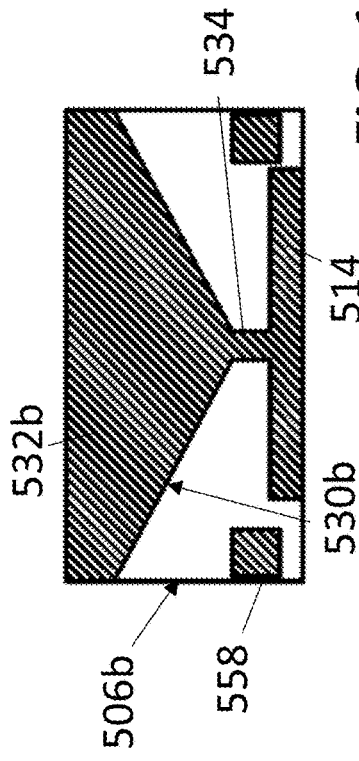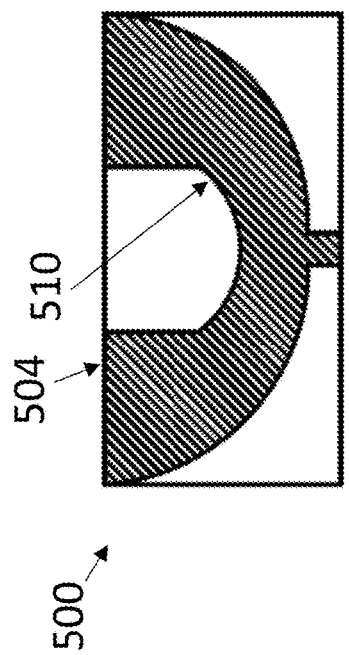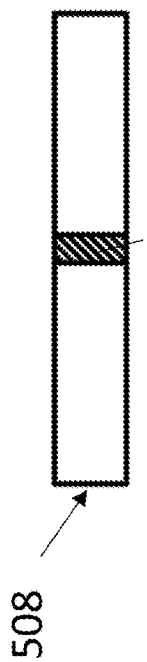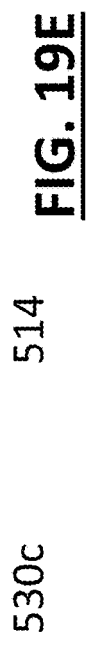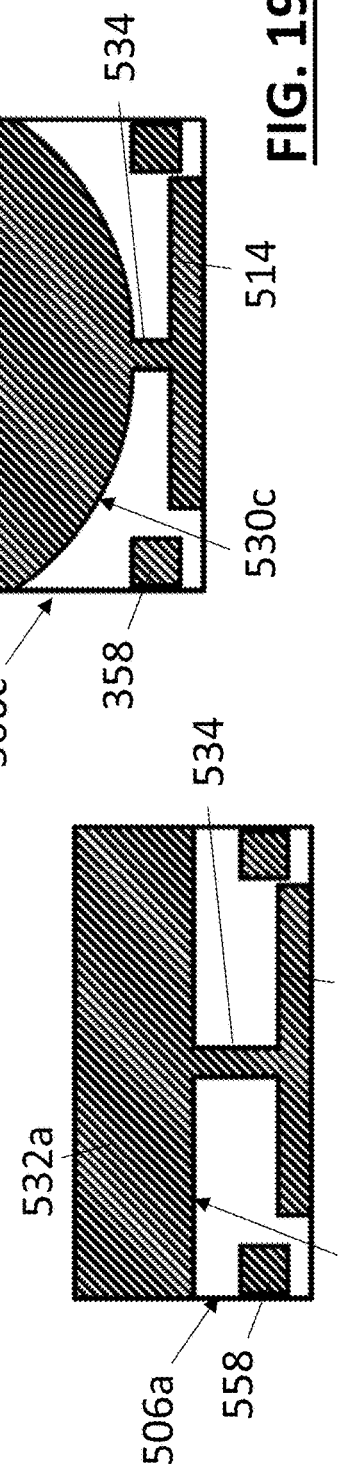

ANTENNA STRUCTURES AND ANTENNA ASSEMBLIES THAT INCORPORATE THE ANTENNA STRUCTURES

PRIORITY

This application is a continuation of, and claims the benefit of priority to, U.S. patent application Ser. No. 17/317,230 filed May 11, 2021 of the same title, which claims the benefit of priority to U.S. Provisional Patent Application Ser. No. 63/024,922 filed on May 14, 2020 entitled "Surface Mount Antenna", and U.S. Provisional Patent Application Ser. No. 63/025,746 filed on May 15, 2020 entitled "Surface Mount Antenna", the contents of each of the foregoing being incorporated herein by reference in its entirety.

COPYRIGHT

A portion of the disclosure of this patent document contains material which is subject to (copyright or mask work) protection. The (copyright or mask work) owner has no objection to the facsimile reproduction by anyone of the patent document or the patent disclosure, as it appears in the Patent and Trademark Office patent file or records, but otherwise reserves all (copyright or mask work) rights whatsoever.

BACKGROUND OF THE DISCLOSURE

1. Technological Field

This disclosure relates generally to antenna structures, and in on exemplary aspect to surface mount dielectric antennas which can be mounted on a printed circuit board to provide wireless communication, and which can be optimized for a particular range of frequencies such as high band frequencies.

2. Field of the Disclosure

Demand for higher bandwidth capability has been driving wireless communications devices with higher frequencies for many years. Frequency bands of devices have risen from megahertz (MHz) to the low gigahertz (GHz). For example, the 6 GHz frequency band is a licensed band often used in 5G communications, which features larger amounts of bandwidth as compared to 3G and 4G communications. The larger bandwidth means that a larger volume of information may be transmitted wirelessly. As a result, multiple applications that require transmission of a large amount of data may be developed to maximize the features of wireless communication around the 6 GHz band.

Previously, Long-Term Evolution (LTE) antennas or ultra-wide band (UWB) antennas (for example, in different packages with different footprints, etc.) were utilized for communications in smaller ranges and with smaller bandwidths than currently desired for 5G communication. Accordingly, it would be desirable to have antenna structures that are operable in any application operating between and including the 1.7 GHz and 6 GHz frequencies while having relatively small footprints such that they do not consume a large amount of space on circuit boards. Moreover, it would be desirable for these antenna structures to provide a suitable response in a small, low cost, and marketable package suitable for the small devices present in, for example, the IoT world. Ideally, these antenna structures may be used to cover a wide variety of frequency bands while also providing performance which may be optimized for many of the new bands being examined for Sub 6 GHz 5G applications.

SUMMARY

In one aspect, an antenna structure is disclosed. In one embodiment, the antenna structure includes: a substrate having a first major face, a second major face, and a side face, the first major face including a first laterally extending conductive structure extending along a first edge of the first major face of the substrate and a pronged conductive structure that includes a first prong extending from a portion of the laterally extending conductive structure towards a first corner of the first major face of the substrate opposite the first edge and a second prong extending from a portion of the laterally extending conductive structure towards a second corner of the first major face of the substrate opposite the first edge. The second major face includes a second laterally extending conductive structure extending along a first edge of the second major face of the substrate and a longitudinally extending conductive structure extending between the laterally extending conductive structure towards a second edge of the second major face of the substrate opposite the first edge. A conductive structure is aligned with the longitudinally extending conductive structure of the second major face, the conductive structure placing the conductive structures on the first major face in electrical communication with the conductive structures on the second major face.

In one variant, the first laterally extending conductive structure is asymmetrically aligned relative to the pronged conductive structure.

In another variant, a first portion of the first laterally extending structure extending from a first side of the pronged conductive structure is longer than a second portion of the first laterally extending structure extending from a second side of the pronged conductive structure.

In yet another variant, the pronged conductive structure includes a substantially V-shaped structure.

In yet another variant, the pronged conductive structure includes a substantially U-shaped structure.

In yet another variant, a width of the first prong increases with increased distance from the first laterally extending structure, and wherein a width of the second prong increases with increased distance from the first laterally extending structure.

In yet another variant, the first laterally extending conductive structure extends along only a portion of the first edge of the first major face of the substrate.

In yet another variant, the first major surface and the second major surface have dimensions of roughly 10 mm by 20 mm.

In yet another variant, the side surface has dimensions of roughly 3 mm by 20 mm.

In another embodiment, the antenna structure includes a ceramic substrate having a first major face, a second major face, and a side face, the first major face. The first major face includes a first laterally extending conductive structure extending along a first edge of the first major face of the ceramic substrate; and a pronged conductive structure having a first prong extending from a portion of the laterally extending conductive structure towards a first corner of the first major face of the ceramic substrate opposite the first edge and a second prong extending from a portion of the laterally extending conductive structure towards a second corner of the first major face of the ceramic substrate opposite the first edge. The second major face includes a second laterally extending conductive structure extending along a first edge of the second major face of the ceramic substrate; and a longitudinally extending conductive structure extending between the laterally extending conductive structure and a second edge of the second major face of the ceramic substrate opposite the first edge. The side face includes a conductive structure aligned with the longitudinally extending conductive structure of the second major face, the conductive structure placing the conductive structures on the first major face in electrical communication with the conductive structures on the second major face.

In one variant, the first laterally extending conductive structure can be asymmetrically aligned relative to the pronged conductive structure. A first portion of the first laterally extending structure extending from a first side of the pronged conductive structure can be longer than a second portion of the first laterally extending structure extending from a second side of the pronged conductive structure.

In another variant, the pronged conductive structure can include a substantially V-shaped structure. The pronged conductive structure can include a substantially U-shaped structure.

In yet another variant, a width of the first prong can increase with increased distance from the first laterally extending structure, and a width of the second prong can increase with increased distance from the first laterally extending structure.

In yet another variant, the first laterally extending conductive structure can extend along only a portion of the first edge of the first major face of the ceramic substrate.

In yet another variant, the first major surface and the second major surface can have dimensions of roughly 10 mm by 20 mm. The side surface can have dimensions of roughly 3 mm by 20 mm.

In another aspect, an antenna assembly is disclosed. In one embodiment, the antenna assembly includes a printed circuit board having a feed line; a ground plane; and an impedance matching component in electrical communication between the feed line and the ground plane; and a surface mount antenna mounted to the printed circuit board, the surface mount antenna including a substrate; a conductive structure on a first major surface of the substrate distal the printed circuit board, the conductive structure including a laterally extending portion extending along a first edge of the first major surface proximal the feed line; a first prong extending away from the laterally extending portion at a first oblique angle to the laterally extending portion; and a second prong extending away from the laterally extending portion at a second oblique angle to the laterally extending portion.

In one variant, the first and second prong form a substantially V-shaped structure.

In another variant, the laterally extending portion is asymmetrically arranged relative to the first and second prongs.

In yet another variant, the first and second prong form a substantially U-shaped structure.

In yet another variant, the printed circuit board has a ground layer on a side of the printed circuit board opposite the ground plane, and a plurality of vias extending through the printed circuit board and electrically connecting the ground plane to the ground layer.

In yet another variant, the printed circuit board has a length of between 30 mm and 65 mm.

In yet another variant, the printed circuit board has a length of between 40 and 45 mm.

In yet another variant, the surface mount antenna includes a substantially T-shaped conductive structure on a second major surface of the surface mount antenna proximate the printed circuit board.

In yet another variant, the surface mount antenna includes a conductive structure on a side surface of the surface mount antenna, the conductive structure on the side surface placing the conductive structure on the first major surface in electrical communication with the conductive structure on the second major surface.

In yet another variant, the first laterally extending conductive structure extends along only a portion of the first edge of the first major face of the substrate.

In yet another variant, the substrate has dimensions of roughly 20 mm×10 mm×3 mm.

In another embodiment, the antenna assembly includes a printed circuit board having a feed line; a ground plane; and an impedance matching component in electrical communication between the feed line and the ground plane. The antenna assembly also includes a surface mount antenna mounted to the printed circuit board, the surface mount antenna including: a ceramic substrate; a conductive structure on a first major surface of the ceramic substrate distal the printed circuit board, the conductive structure including a laterally extending portion extending along a first edge of the first major surface proximal the feed line; a first prong extending away from the laterally extending portion at a first oblique angle to the laterally extending portion; and a second prong extending away from the laterally extending portion at a second oblique angle to the laterally extending portion.

In one variant, the first and second prong can form a substantially V-shaped structure. The first and second prong can form a substantially U-shaped structure. The laterally extending portion can be asymmetrically arranged relative to the first and second prongs.

In another variant, the printed circuit board can include a ground layer on a side of the printed circuit board opposite the ground plane, and a plurality of vias extending through the printed circuit board and electrically connecting the ground plane to the ground layer. The printed circuit board can have a length of between 30 mm and 65 mm. The printed circuit board can have a length of between 40 and 45 mm.

In yet another variant, the surface mount antenna can include a substantially T-shaped conductive structure on a second major surface of the surface mount antenna proximate the printed circuit board. The surface mount antenna can include a conductive structure on a side surface of the surface mount antenna, the conductive structure on the side surface placing the conductive structure on the first major surface in electrical communication with the conductive structure on the second major surface.

In yet another variant, the first laterally extending conductive structure can extend along only a portion of the first edge of the first major face of the ceramic substrate. The ceramic substrate can have dimensions of roughly 20 mm×10 mm×3 mm.

BRIEF DESCRIPTION OF THE DRAWINGS

The above-mentioned aspects, as well as other features, aspects, and advantages of the present technology will now be described in connection with various aspects, with reference to the accompanying drawings. The illustrated aspects, however, are merely examples and are not intended to be limiting. Throughout the drawings, similar symbols typically identify similar components, unless context dictates otherwise. Note that the relative dimensions of the following figures may not be drawn to scale.

FIG. 2A is a top plan view of an antenna such as the antenna of FIG. 1A mounted on a printed circuit board (PCB).

FIG. 2B is a side view of the antenna and PCB of FIG. 2A.

FIG. 2C is a bottom plan view of the antenna and PCB of FIG. 2A.

FIG. 5 is a table illustrating various aspects of performance of the antenna of FIG. 1A when used with a PCB with and without impedance matching.

FIG. 6 is a table illustrating various aspects of performance of the antenna of FIG. 1A when used with PCBs of various lengths between 30 mm and 65 mm.

FIG. 7 is a table illustrating maximum return loss of the antenna of FIG. 1A when used with PCBs of various lengths between 30 mm and 65 mm.

FIG. 9A is a plot and FIG. 9B is a series of tables illustrating return loss of the antenna of FIG. 1A when used with PCBs of various lengths.

FIG. 11A is a plot and FIG. 11B is a series of tables illustrating efficiency of the antenna of FIG. 1A when used with PCBs of various lengths.

FIG. 13A is a plot and FIG. 13B is a series of tables illustrating average gain of the antenna of FIG. 1A when used with PCBs of various lengths.

FIG. 15A is a plot and FIG. 15B is a series of tables illustrating peak gain of the antenna of FIG. 1A when used with PCBs of various lengths.

FIGS. 16A to 16G illustrate various views of alternative embodiments of an alternative antenna design.

FIGS. 17A to 17E illustrate various views of alternative embodiments of another alternative antenna design.

FIGS. 18A to 18G illustrate various views of alternative embodiments of another alternative antenna design.

FIGS. 19A to 19E illustrate various views of alternative embodiments of another alternative antenna design.

Figure 1A:
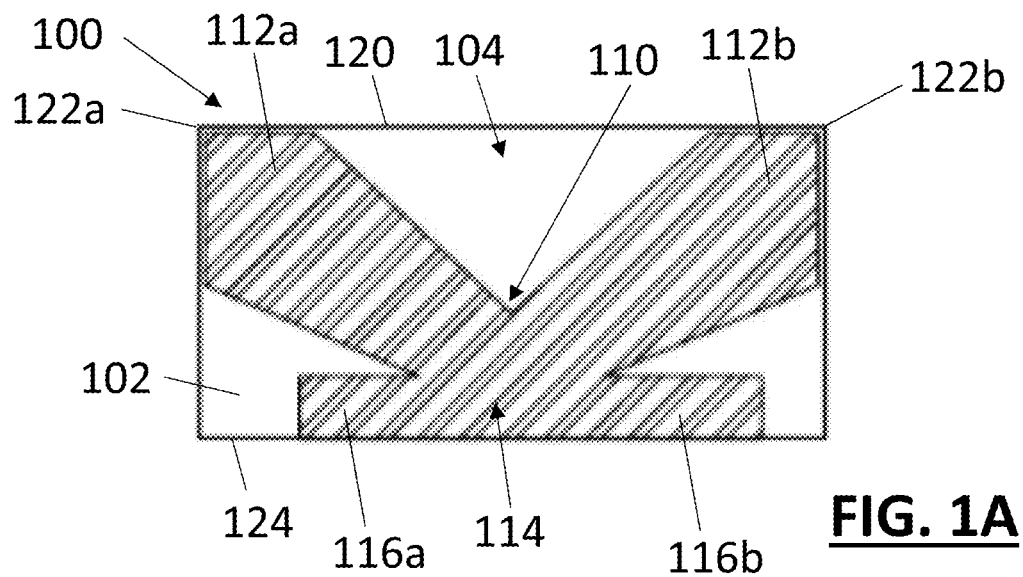
FIG. 1A is a top plan view of a surface mount antenna.

All Figures disclosed herein are © Copyright 2020-2021 Taoglas Group Holdings Limited. All rights reserved.

DETAILED DESCRIPTION

Various aspects of the novel systems, apparatuses, and methods are described more fully hereinafter with reference to the accompanying drawings. The teachings disclosure may, however, be embodied in many different forms and should not be construed as limited to any specific structure or function presented throughout this disclosure. Rather, these aspects are provided so that this disclosure will be thorough and complete and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

As discussed above, certain of the devices described herein may be used in the implementation of an Internet of Things (IoT) standard, for example. Such devices may be used, for example, for smart metering or in a smart grid network. Such devices may provide sensor applications or be used in home automation. The devices may instead or in addition be used in a healthcare context, for example for personal healthcare. They may also be used for surveillance, to enable extended-range Internet connectivity, or to implement machine-to-machine communications. Although various systems, methods, and apparatuses are described herein with respect to an IoT standard, for example, a person having ordinary skill in the art will appreciate that the present disclosure is applicable to other wireless communication standards as well.

Demand for higher bandwidth capability has been driving wireless communications devices with higher frequencies for many years. Frequency bands of devices have risen from megahertz (MHz) to the low gigahertz (GHz).

The 6 GHz frequency band is a licensed band often used in 5G communications, which features larger amounts of bandwidth as compared to 3G and 4G communications. The larger bandwidth means that a larger volume of information may be transmitted wirelessly. As a result, multiple applications that require transmission of a large amount of data may be developed to maximize the features of wireless communication around the 6 GHz band.

The antenna structures described herein relate to the field of surface mounted antennas in electronic devices. Previously, Long-Term Evolution (LTE) antennas or ultra-wide band (UWB) antennas (for example, in different packages with different footprints, etc.) were utilized for communications in smaller ranges and with smaller bandwidths than currently desired for 5G communication. The antenna structures described herein allow for one antenna with a single footprint that is operable in any application operating between and including the 1.7 GHz and 6 GHz frequencies while having relatively small footprints such that they do not consume a large amount of space on circuit boards. Accordingly, the antenna structures described herein result in increased lower and upper frequency limits while still maintaining the same footprint and structural volume in the different applications as compared to existing antenna structures.

The antenna structures described herein provide a suitable response in a small, low cost, and marketable package suitable for the small devices present in the IoT world. These antenna structures may be used to cover a wide variety of frequency bands while also providing performance which may be optimized for many of the new bands being examined for Sub 6 GHz 5G applications.

Figure 1B:
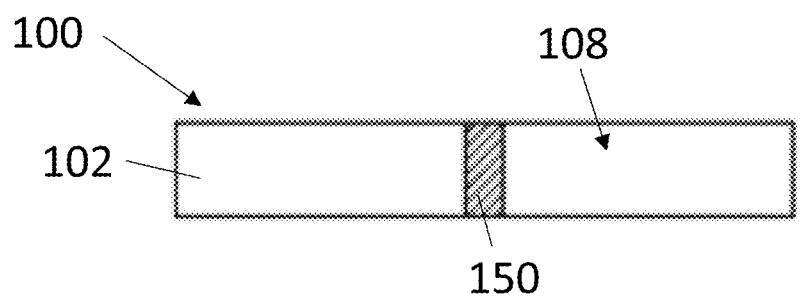
FIG. 1B is a front elevation view of the antenna of FIG. 1A.
Figure 1C:
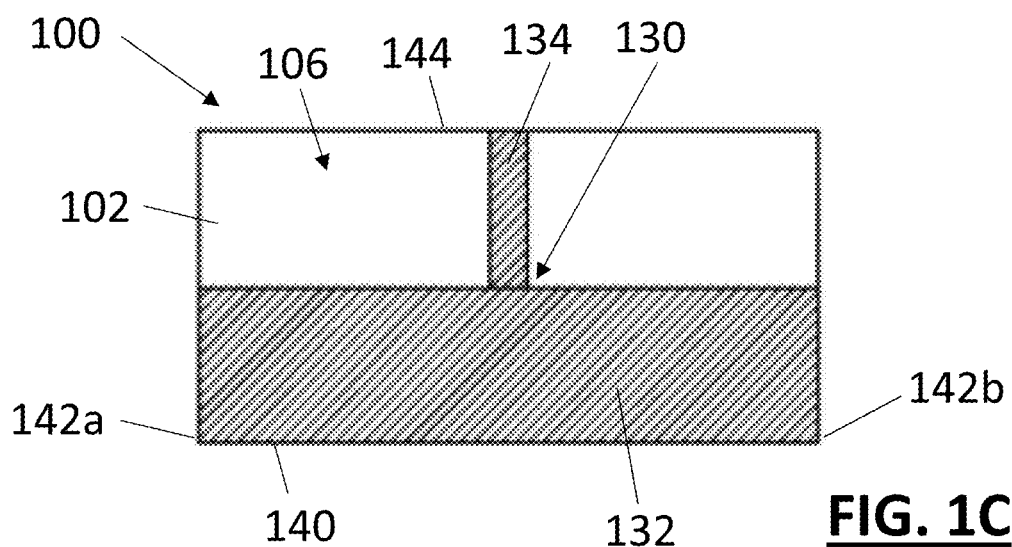
FIG. 1C is a bottom plan view of the antenna of FIG. 1A.

FIG. 1A is a top plan view of a surface mount antenna, which may be a surface mount dielectric (SMD) patch antenna. FIG. 1B is a front elevation view of the antenna of FIG. 1A. FIG. 1C is a bottom plan view of the antenna of FIG. 1A.

The antenna 100 includes a substrate 102 which in the illustrated embodiment is in the shape of a rectangular prism having six generally rectangular faces. The faces include a top major face 104, a bottom major face 106, and a side face 108, in addition to other faces not specifically labeled in these figures. Each of the top major face 104, the bottom major face 106, and the side face 108 may have conductive sections formed thereon. Although the conductive sections are referred to as being formed on the faces of the substrate 102, one or more additional layers or labels may be formed over the conductive sections and may obscure view of the conductive sections.

In some implementations, the substrate 102 comprises a ceramic material, although in other embodiments, other suitable materials, such as materials formed of a composite material composed of woven fiberglass cloth with an epoxy resin binder (e.g., FR-4) that is flame resistant (self-extinguishing) or otherwise having high dielectric constants, may be used. In one embodiment, the substrate 102 may have a width of about 20 mm, a length of about 10 mm, and a height of about 3 mm, although other suitable dimensions may also be used in other embodiments. The conductive sections may comprise, for example, any suitable trace material used in electronics and antenna manufacturing, such as copper, for example.

The top major face 104, visible in FIG. 1A, includes a pronged conductive section 110. In the illustrated embodiment, the pronged conductive section 110 is a generally V-shaped conductive section formed from a pair of diagonally extending sections 112a and 112b which extend from the corners 122a and 122b at the sides of a first edge 120 of the top major face towards a point at or near the center point of a second edge 124 opposite the first edge 120. The width of these diagonally extending sections 112a and 112b decreases with increased distance from edge 120.

The top major face 104 also includes a laterally extending conductive section 114 formed at or near the edge 124. The laterally extending conductive section 114 overlaps with the vertex of the pronged conductive section 110, with a first arm 116a extending outward to a first side of the pronged conductive section 110 and a second arm 116b extending outward to a second side of the pronged conductive section 110. In the illustrated embodiment, the laterally extending conductive section 114 is asymmetrically positioned with respect to the pronged conductive section 110, such that the second arm 116b extends outward a greater distance than the first arm 116a.

The combination of the pronged conductive section 110 and the laterally extending conductive section 114 can provide an ultra-wideband effect. In some embodiments, such as the embodiment illustrated in FIGS. 1A to 1C, the antenna 100 may be optimized for high band performance, at frequencies at or near the top of the frequency range extending between 1.7 GHz and 6 GHz. This asymmetry of the laterally extending conductive section 114, in which the second arm 116b extends further from the pronged conductive section 110 than the first arm 116a, improves the high band performance of the antenna 100.

The bottom major face 106 of the antenna 100 includes a branching conductive structure 130. In the illustrated embodiment, the branching conductive structure 130 is a generally T-shaped structure, including a laterally extending portion 132 extending along or adjacent an edge 140 of the bottom major face 106 of the antenna 100. In the illustrated embodiment, the laterally extending portion 132 extends between the corners 142a and 142b at the sides of edge 140. The branching conductive structure 130 also includes a longitudinally extending portion 134 extending between the laterally extending portion 132 and the edge 144 opposite the edge 140. The longitudinally extending portion 134 runs generally perpendicular to the laterally extending portion at or near a centerline of the bottom major face 106 of the antenna 100.

A side face 108 of the antenna 100, visible in FIG. 1B, includes a conductive section 150 extending at or near a centerline of the side face 108 of the antenna 100, and extending along the height of the side face 108. This conductive section 150 may be aligned with the longitudinally extending portion 132 on the bottom major face 106 and may place the branching conductive structure 130 on the bottom major face 106 in electrical communication with the conductive structures on the top major face 104. In some implementations, one or more conductive via through holes may be utilized instead of, or in addition to, the conductive section 150, and may provide conductivity between the conductive structures on the top major face 104 and the conductive structures on the bottom major face 106.

As discussed in greater detail below, the shapes of the conductive structures depicted in FIGS. 1A to 1C are exemplary, and other sizes and shapes may also be used.

A surface mount antenna such as antenna 100 may require a separate ground plane for operation. In some embodiments, the ground plane may be part of a printed circuit board (PCB) on which the antenna is mounted and aligned with structures on the PCB. FIG. 2A is a top plan view of an antenna such as the antenna of FIG. 1A mounted on a printed circuit board (PCB). FIG. 2B is a side view of the antenna and PCB of FIG. 2A. FIG. 2C is a bottom plan view of the antenna and PCB of FIG. 2A.

The antenna 100 is mounted in a first region 162 of the PCB 160, which can be generally free from conductive material. The PCB 160 also includes a second region 164 including a feed line 170, a ground plane 182, and an impedance matching circuit 190. On the underside of the PCB 160, visible in FIG. 2C, is a ground layer 184, connected to the ground plane 182 by means of a plurality of vias 186. The PCB may comprise any suitable substrate material used in electronics and antenna manufacturing, for example FR-4, IT-180, or any other suitable PCB material. The conductive structures such as feed line 170, a ground plane 182 may again comprise any suitable trace material used in electronics and antenna manufacturing, such as copper.

The feed line 170 extends between a first end 172 adjacent the antenna 100 and a second end 174 which can be connected through the PCB to a connector 176 on the underside of the PCB 160. The first end 172 can extend into the region 162 of the PCB on which the antenna 100 is mounted. The antenna 100 can be mounted so that a portion of the conductive structure on the antenna 100, such as the longitudinally extending portion 132 on the bottom major face 106, can be aligned with the feed line 170 to place the feed line 170 in electrical communication with the conductive structures on the antenna 100.

Figure 3:
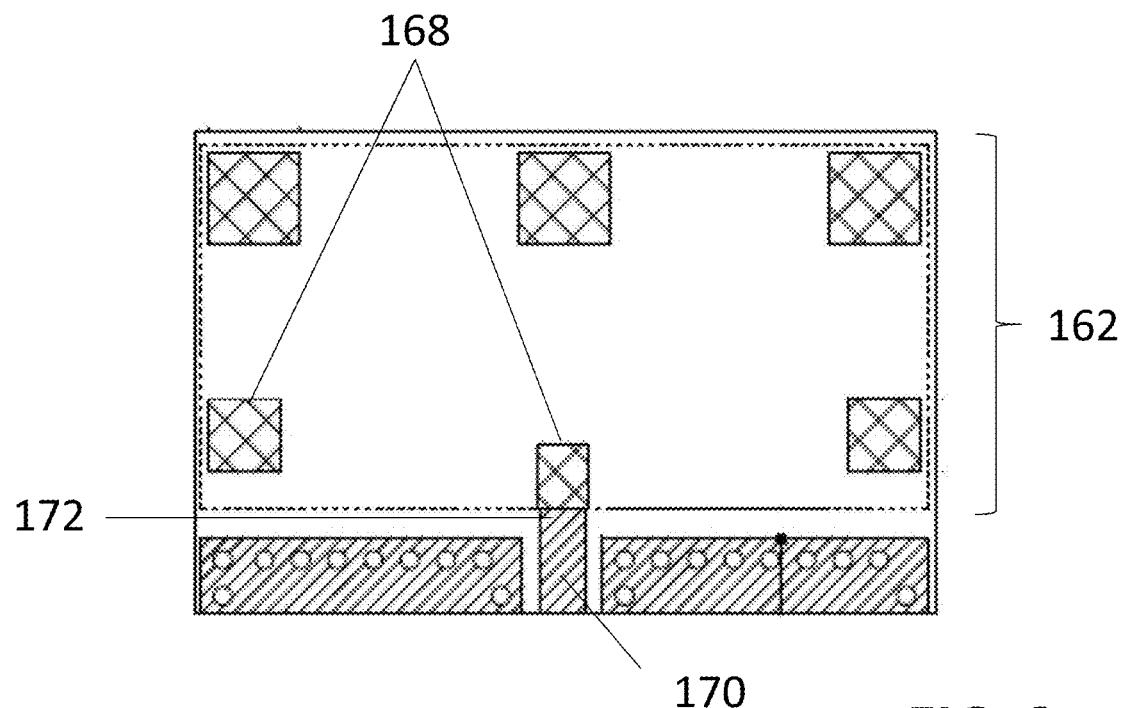
FIG. 3 is a detail top plan view of a section of the PCB of FIG. 2A underlying the antenna.

FIG. 3 is a detail top plan view of a section of the PCB of FIG. 2A underlying the antenna. In particular, FIG. 3 primarily illustrates first region 162 of the PCB 160, to which the antenna 100 will be bonded. It can be seen in FIG. 3 that the PCB 160 includes a plurality of solder locations 168 within the first region 162 of the PCB 160. One of the solder locations is aligned with the first end 172 of the feed line 170.

Figure 4:
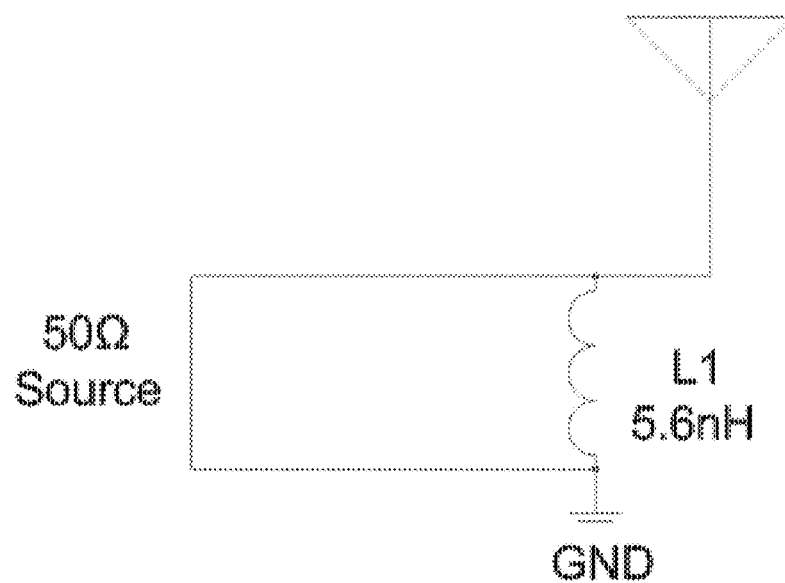
FIG. 4 is a schematic illustration of an exemplary impedance matching circuit.

FIG. 4 is a schematic illustration of an exemplary impedance matching circuit. As can be seen in FIG. 4, the impedance matching circuit includes a 5.6 nH inductor between the feed line 170 and the ground plane 182. In other embodiments, other suitable component values and configurations of impedance matching circuits may be used.

Because the dimensions and configuration of the PCB 160 will affect the operation of the antenna 100, the PCB 160 design, including the length of the PCB 160, can have a significant effect on the performance of the antenna 100. The following exemplary test results illustrate the effects of the PCB 160 length and the use of an impedance matching circuit.

FIG. 5 is a table illustrating various aspects of performance of the antenna of FIG. 1A when used with a PCB with and without impedance matching. In particular, FIG. 5 illustrates efficiency average, average gain, peak gain, and maximum return loss for a number of frequency bands within the range of roughly 1.7 GHz to 6 GHz when using a PCB 55 mm in length, with and without impedance matching. The use of impedance matching improves the average efficiency to 55% to 70% across the range of roughly 1.7 GHz to 6 GHz.

FIG. 6 is a table illustrating various aspects of performance of the antenna of FIG. 1A when used with PCBs of various lengths between 30 mm and 65 mm. In particular, FIG. 6 illustrates efficiency average, average gain, and peak gain for a number of frequency bands within the range of roughly 1.7 GHz to 6 GHz when used with PCBs of various lengths between 30 mm and 65 mm, with impedance matching.

FIG. 7 is a table illustrating maximum return loss of the antenna of FIG. 1A when used with PCBs of various lengths between 30 mm and 65 mm. In particular, FIG. 7 illustrates maximum return loss for a number of frequency bands within the range of roughly 1.7 GHz to 6 GHz.

Figure 8:
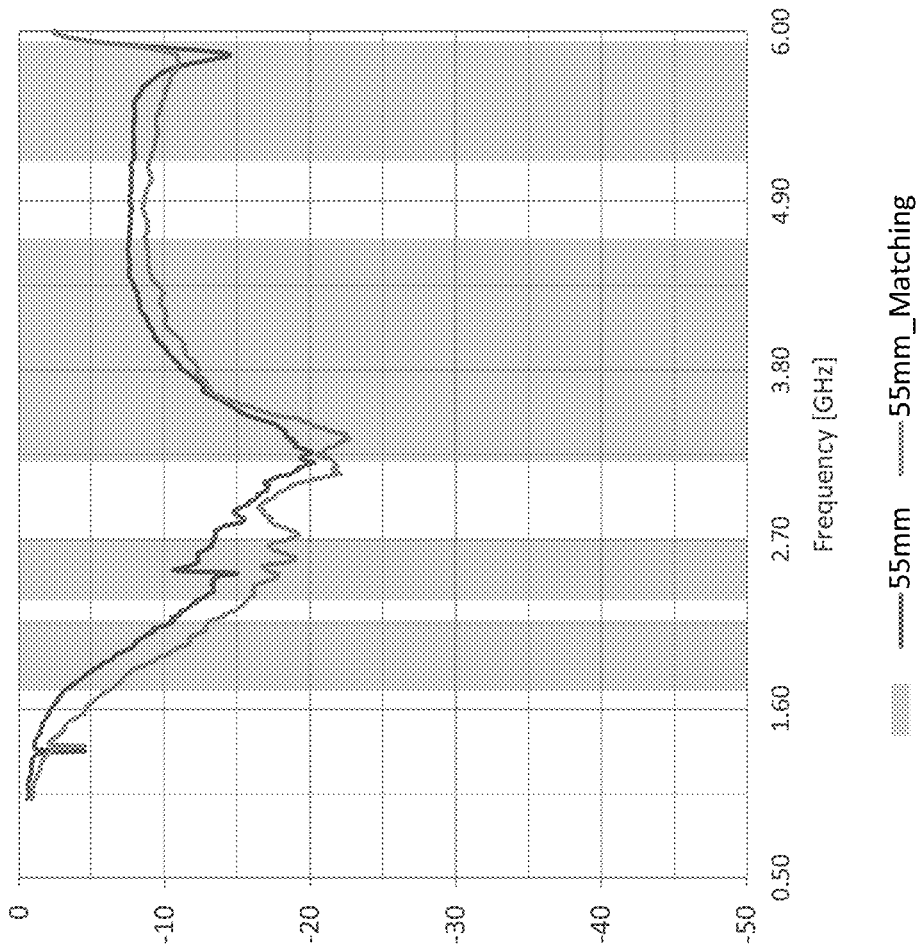
FIG. 8 is a plot and a series of tables illustrating return loss of the antenna of FIG. 1A when used with a PCB with and without impedance matching.

FIG. 8 is a plot and a series of tables illustrating return loss of the antenna of FIG. 1A when used with a PCB with and without impedance matching. In particular, FIG. 8 illustrates return loss for a number of frequency bands within the range of roughly 1.7 GHz to 6 GHz when using a PCB 55 mm in length, with and without impedance matching.

Figure 9A:
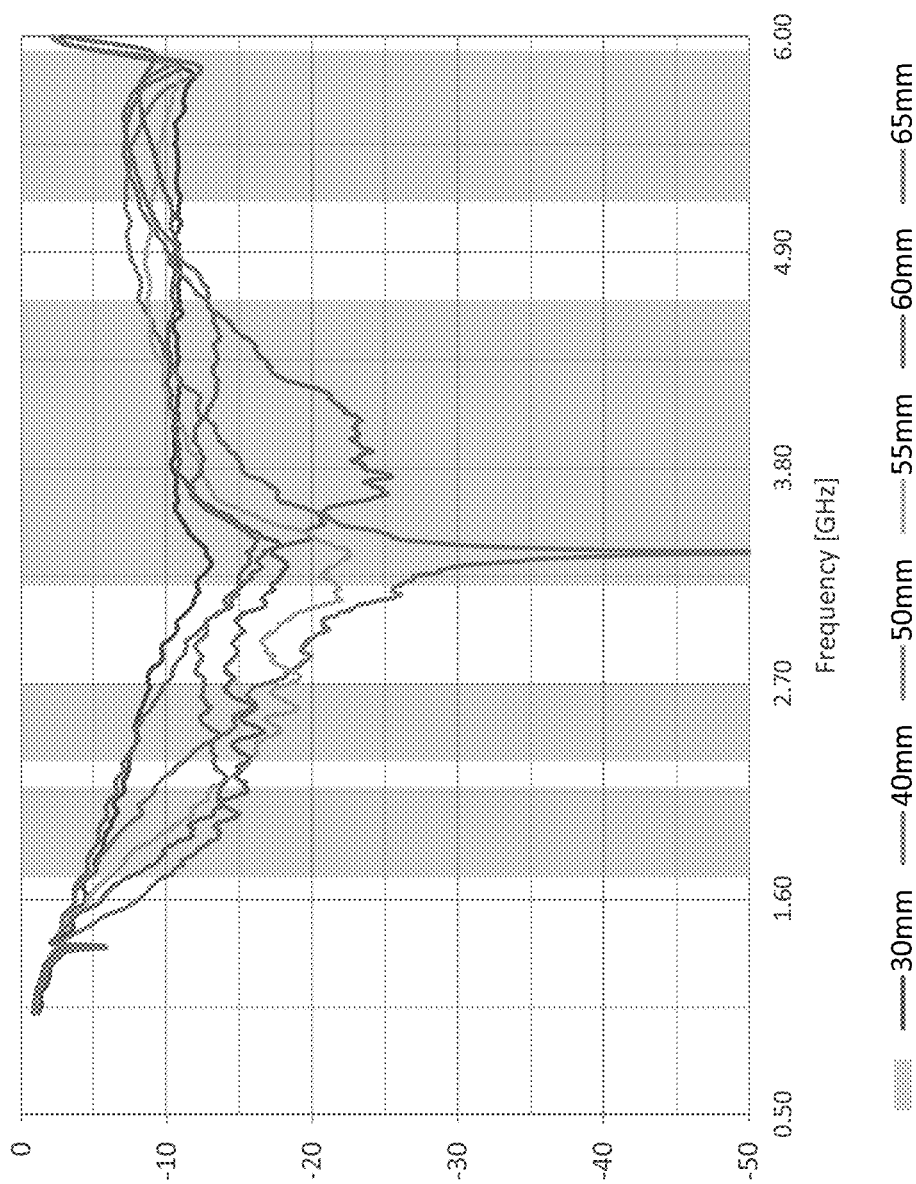

FIG. 9A is a plot and FIG. 9B is a series of tables illustrating return loss of the antenna of FIG. 1A when used with PCBs of various lengths. In particular, FIGS. 9A and 9B illustrate return loss for a number of frequency bands within the range of roughly 1.7 GHz to 6 GHz when used with PCBs of various lengths between 30 mm and 65 mm, using impedance matching.

Figure 10:
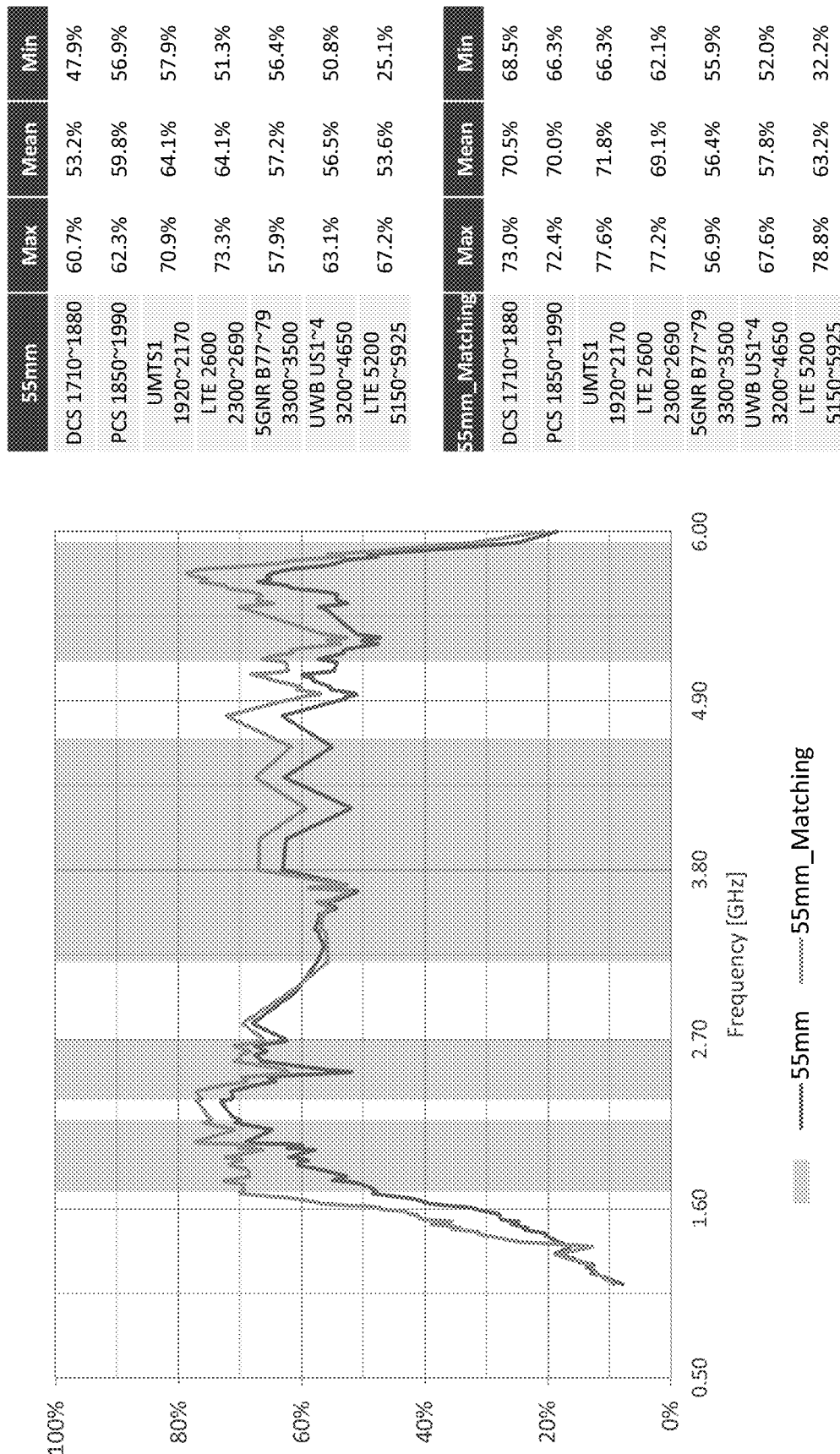
FIG. 10 is a plot and a series of tables illustrating efficiency of the antenna of FIG. 1A when used with a PCB with and without impedance matching.

FIG. 10 is a plot and a series of tables illustrating efficiency of the antenna of FIG. 1A when used with a PCB with and without impedance matching. In particular, FIG. 10 illustrates efficiency for a number of frequency bands within the range of roughly 1.7 GHz to 6 GHz when using a PCB 55 mm in length, with and without impedance matching.

Figure 11A:
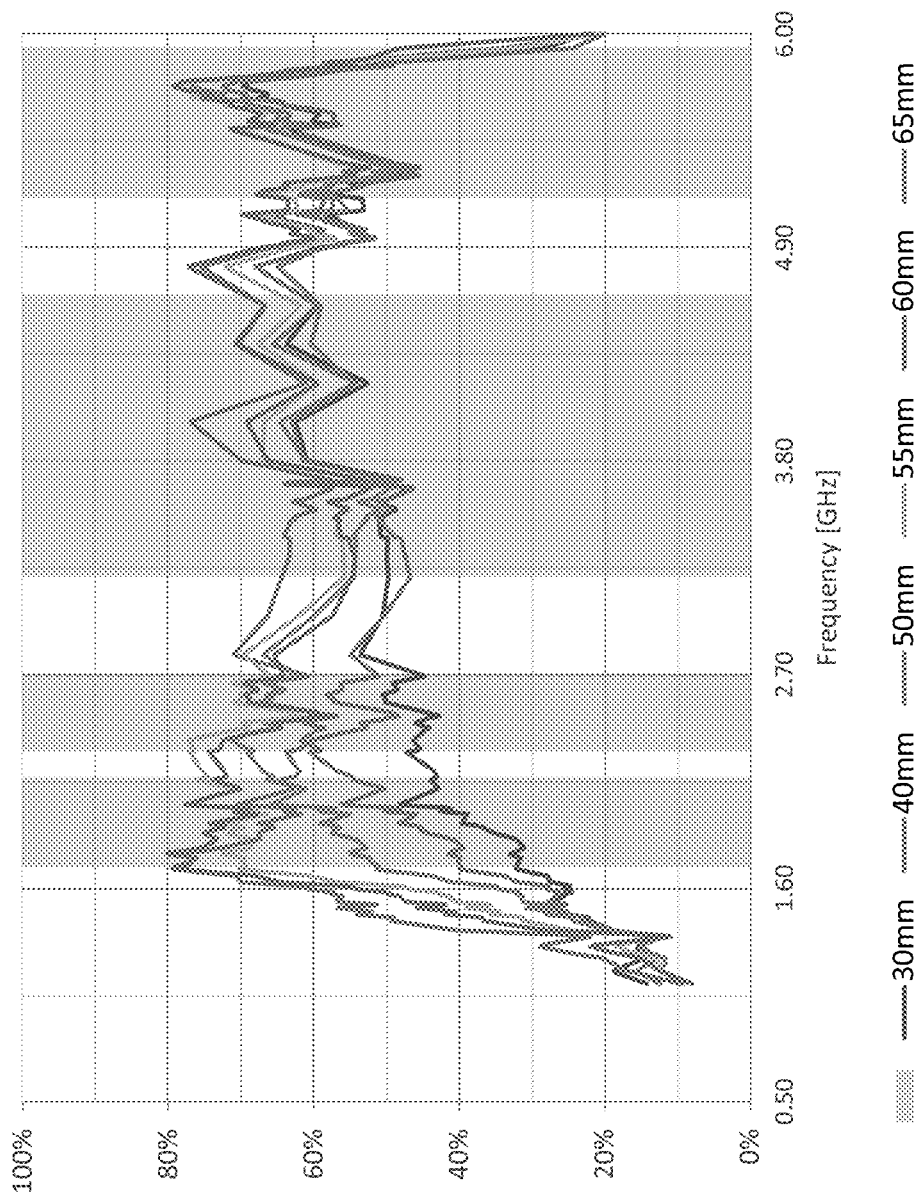

FIG. 11A is a plot and FIG. 11B is a series of tables illustrating efficiency of the antenna of FIG. 1A when used with PCBs of various lengths. In particular, FIGS. 11A and 11B illustrate efficiency for a number of frequency bands within the range of roughly 1.7 GHz to 6 GHz when used with PCBs of various lengths between 30 mm and 65 mm, using impedance matching.

Figure 12:
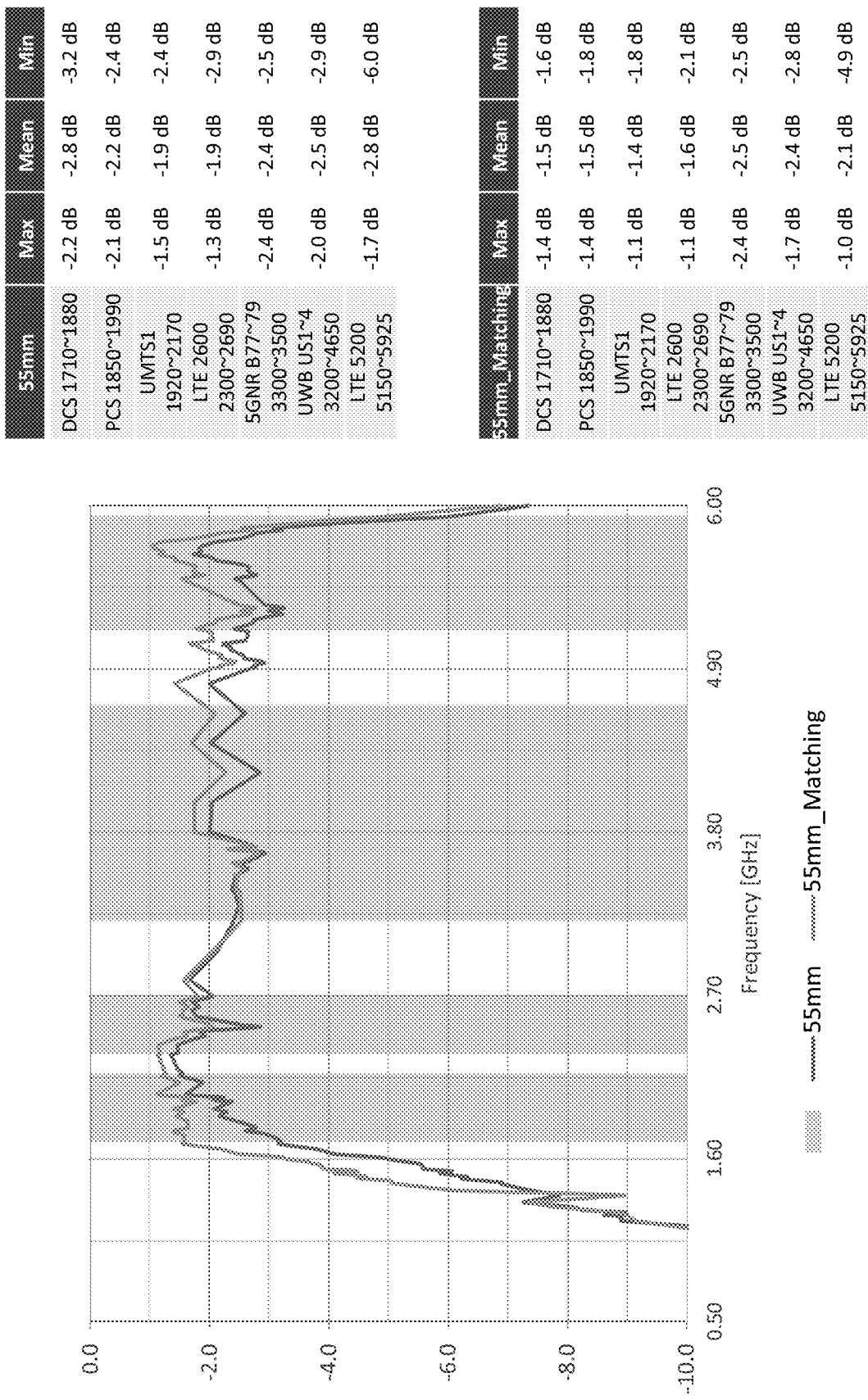
FIG. 12 is a plot and a series of tables illustrating average gain of the antenna of FIG. 1A when used with a PCB with and without impedance matching.

FIG. 12 is a plot and a series of tables illustrating average gain of the antenna of FIG. 1A when used with a PCB with and without impedance matching. In particular, FIG. 12 illustrates average gain for a number of frequency bands within the range of roughly 1.7 GHz to 6 GHz when using a PCB 55 mm in length, with and without impedance matching.

Figure 13A:
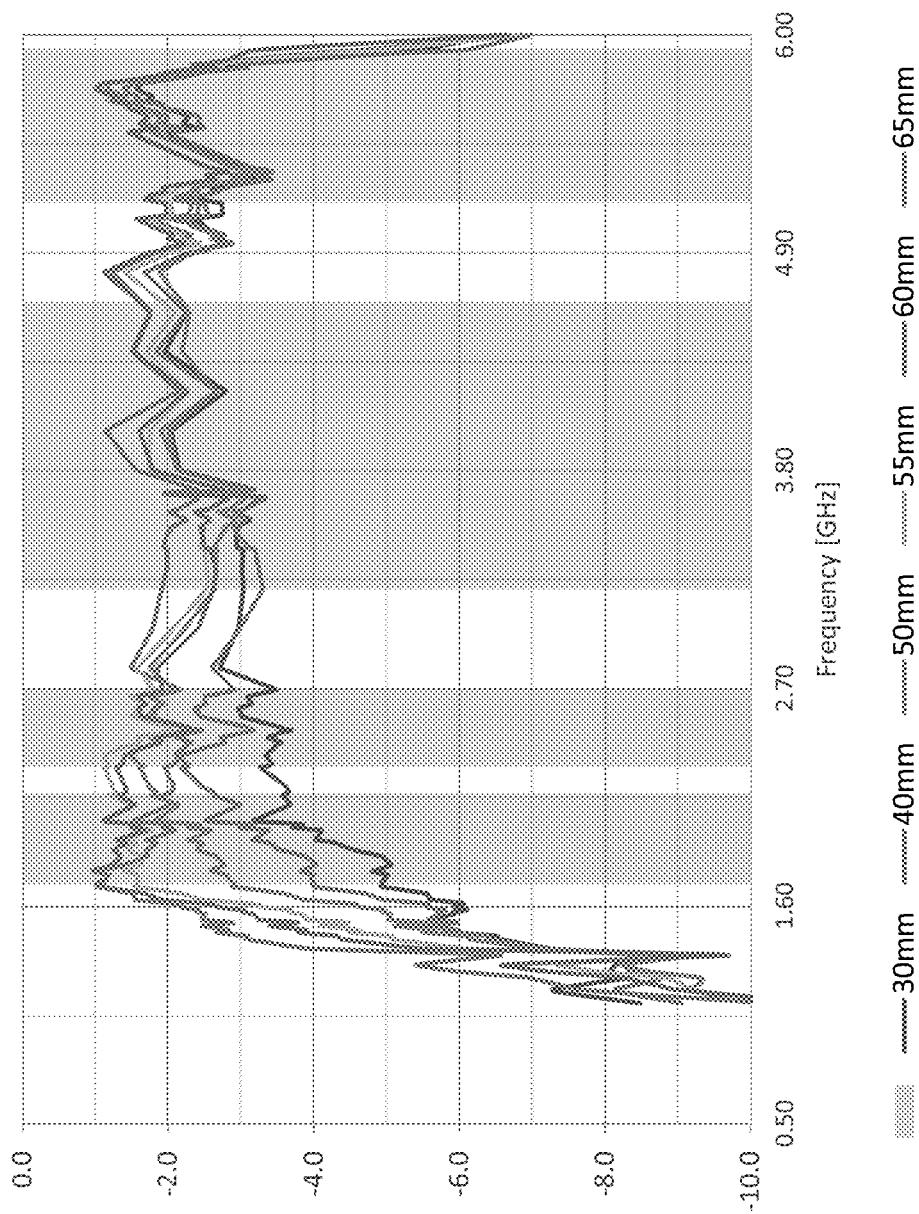

FIG. 13A is a plot and FIG. 13B is a series of tables illustrating average gain of the antenna of FIG. 1A when used with PCBs of various lengths. In particular, FIGS. 13A and 13B illustrate average gain for a number of frequency bands within the range of roughly 1.7 GHz to 6 GHz when used with PCBs of various lengths between 30 mm and 65 mm, using impedance matching.

Figure 14:
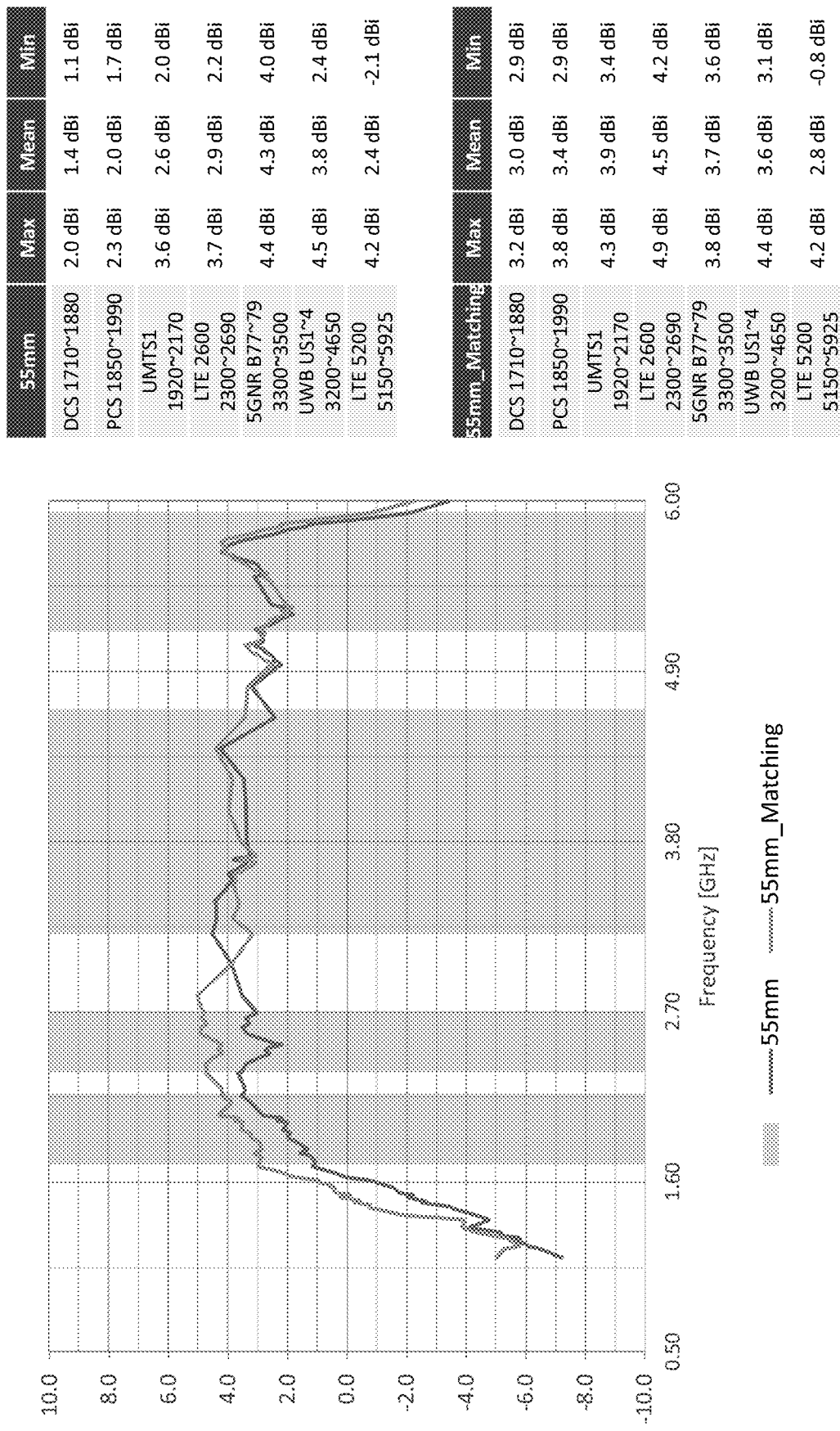
FIG. 14 is a plot and a series of tables illustrating peak gain of the antenna of FIG. 1A when used with a PCB with and without impedance matching.

FIG. 14 is a plot and a series of tables illustrating peak gain of the antenna of FIG. 1A when used with a PCB with and without impedance matching. In particular, FIG. 14 illustrates peak gain for a number of frequency bands within the range of roughly 1.7 GHz to 6 GHz when using a PCB 55 mm in length, with and without impedance matching.

Figure 15A:
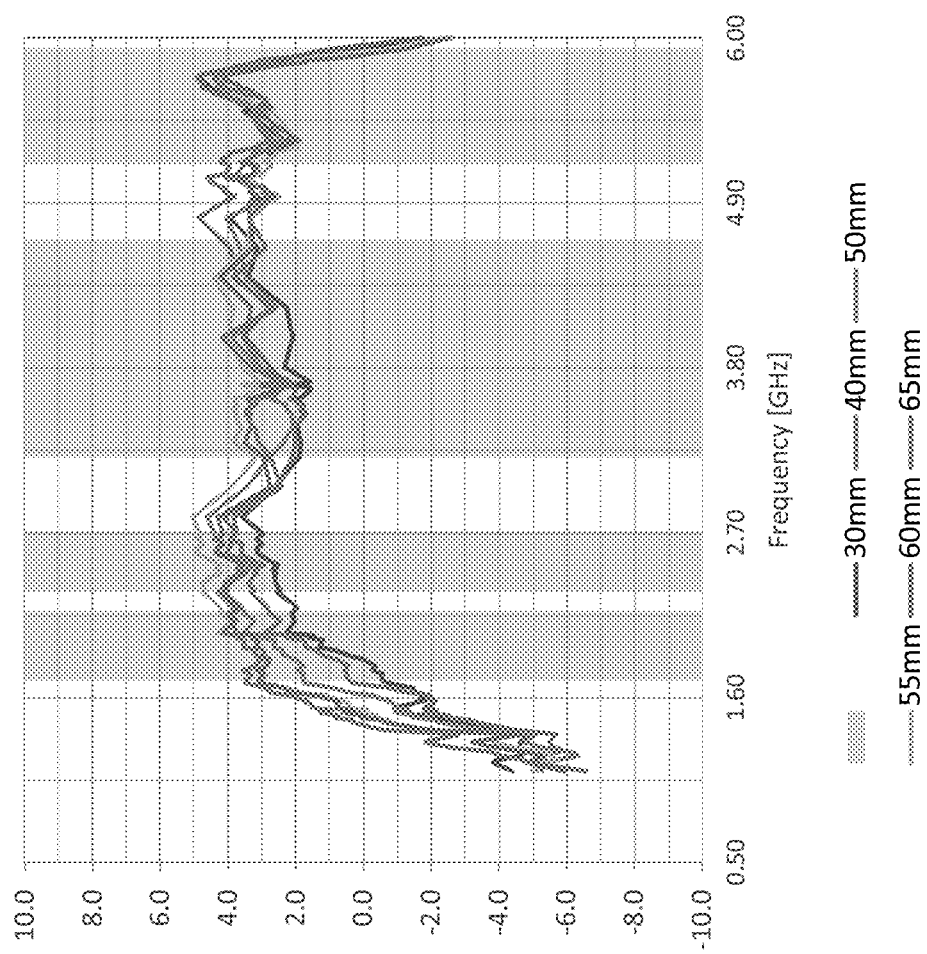

FIG. 15A is a plot and FIG. 15B is a series of tables illustrating peak gain of the antenna of FIG. 1A when used with PCBs of various lengths. In particular, FIGS. 15A and 15B illustrate peak gain for a number of frequency bands within the range of roughly 1.7 GHz to 6 GHz when used with PCBs of various lengths between 30 mm and 65 mm, using impedance matching.

As discussed above, a number of alternative designs may be used for the conductive structures on an antenna substrate. FIGS. 16A to 16G illustrate various views of alternative embodiments of an alternative antenna design.

FIG. 16A is a top view of a first major surface 204 of an antenna 200. The first major surface 204 includes a pronged or branching conductive portion 210 which, in the illustrated embodiment, is a generally V-shaped structure, like the V-shaped conductive structure of the antenna 100. The first major surface 204 also includes a laterally extending conductive portion 214 extending from the sides of the branching conductive portion 210 near the base or vertex of the branching conductive portion 210. The laterally extending conductive portion 214 may be asymmetrically arranged relative to the branching conductive portion 210 so that the laterally extending conductive portion 214 extends further outward from a first side of the branching conductive portion 210 than from the opposite side.

FIG. 16B illustrates a first embodiment of a side surface 208a which includes a conductive structure 250a. Like the conductive structure 150 of the antenna 100, the conductive structure 250a is a generally linear structure extending between the first and second major surfaces of the antenna 200. In some implementations, one or more conductive via through holes may be utilized instead of, or in addition to, the conductive section 250, and may provide conductivity between the conductive structures on the first major face 204 and the conductive structures on a second major surface 206.

FIG. 16C illustrates a second embodiment of a side surface 208b. In contrast to the conductive structure 250a of the side surface 208a of FIG. 16B, the conductive structure 250b does not have a substantially constant width along its height. Rather, a first portion 256a adjacent a first major surface of the antenna 200 is wider than a second portion 256b adjacent a second major surface of the antenna 200. In the embodiment illustrated in FIG. 16C, the first portion 256a has a substantially constant first width and the second portion 256b has a substantially constant second width, such that the conductive structure 250b is a generally T-shaped structure. In some embodiments, the wider first portion 256a can be adjacent the major surface of the antenna 200 which includes a laterally extending conductive structure, such as laterally extending conductive structure 214 extending along an edge adjacent the side surface 208b. As discussed herein, such a laterally extending conductive structure 214 may be asymmetrically arranged relative to a centerline of the major surface of the antenna 200 on which it is located.

FIG. 16D illustrates a third embodiment of a side surface 208c. Like the conductive structure 250b of the side surface 208a of FIG. 16B, the conductive structure 250b does not have a substantially constant width along its height. A first portion 256a'adjacent a first major surface of the antenna 200 has a tapering shape wider than a second portion 256b'adjacent a second major surface of the antenna 200. In the illustrated embodiment, the second portion 256b'has a generally constant second width along its height, and the first portion 256a'has a frustopyramidal shape extending from the smaller second width adjacent the second portion 256b'to a first wider width at the edge of the side surface 208c.

The exemplary shapes illustrated in FIGS. 16B to 16D are not an exhaustive list of all possible shapes. In some embodiments in which the conductive structure has a tapering width, the taper may not be linear, but may instead be curved. In some embodiments, all or substantially all of the conductive structure may have a frustopyramidal shape. Any other suitable shape may also be used.

FIG. 16E illustrates an embodiment of a second major surface 206a. Like the antenna 100, the second major surface 206a includes a branching conductive structure 230a which in the illustrated embodiment is a generally T-shaped structure, including a laterally extending portion 232a extending along or adjacent an edge of the second major face 206a of the antenna 200, and a longitudinally extending portion 234 extending between the laterally extending portion 232a and the opposite edge. The longitudinally extending portion 234 runs generally perpendicular to the laterally extending portion 232b at or near a centerline of the bottom second major face 206a of the antenna 200. In the illustrated embodiment, the longitudinally extending portion 234 has a substantially constant width. The longitudinal thickness of the laterally extending portion 232a is substantially constant across the laterally extending portion 232a, giving the branching conductive structure 230a a T-shape. The second major surface 206a may also include conductive pads 258 aligned with the solder locations 168 on a PCB 160 to which the antenna 200 will be attached.

FIG. 16F illustrates a second embodiment of a second major surface 206b. Like the second major surface 206a, the second major surface 206b includes a branching conductive structure 230b which includes a laterally extending portion 232b extending along or adjacent an edge of the second major face 206b of the antenna 200, and a longitudinally extending portion 234 extending in a generally perpendicular direction between the laterally extending portion 232b and the opposite edge. In contrast to the laterally extending portion 232b of the branching conductive structure 230a, the laterally extending portion 232b of the branching conductive structure 230b does not have a substantially constant longitudinal thickness. Instead, the longitudinal thickness of the laterally extending portion 232b decreases from a first thickness adjacent the laterally extending portion 232b to a second thickness at the side edges of the second major surface 206b. In the illustrated embodiment, the laterally extending portion 232b has a generally linear taper between the first thickness and the second thickness, giving a portion of the laterally extending portion 232b a frustopyramidal or V-shaped appearance.

FIG. 16G illustrates a second embodiment of a second major surface 206b. Like the second major surface 206b, the second major surface 206c includes a branching conductive structure 230b which includes a laterally extending portion 232b extending along or adjacent an edge of the second major face 206b of the antenna 200, and a longitudinally extending portion 234 extending in a generally perpendicular direction between the laterally extending portion 232b and the opposite edge, where the laterally extending portion 232b has a varying longitudinal thickness. However, unlike the branching conductive structure 230b, the variance between the maximum longitudinal thickness and the minimum longitudinal thickness is not linear. Instead, the rate of taper increases with increased distance from the longitudinally extending portion 234. The varying rate of taper of the illustrated embodiment gives a portion of the laterally extending portion 232c adjacent the longitudinally extending portion 234 a convex curved shape.

The exemplary shapes illustrated in FIGS. 16E to 16G are not an exhaustive list of all possible shapes for a second major surface of the antenna 200. Any other suitable shape may also be used. Any suitable combination of the side surfaces and second major surfaces may be used in an embodiment of the antenna 200.

FIGS. 17A to 17E illustrate various views of various alternative embodiments of another alternative antenna design. FIG. 17A illustrates a first major surface 304 of the antenna 300 which includes a pronged or branching conductive portion 310 and which, in the illustrated embodiment, is a generally V-shaped structure, like the V-shaped conductive structure of the antenna 100. However, the first major surface 304 differs from the first major surface 104 of the antenna 100 in that the first major surface 304 does not include a laterally extending conductive portion extending outward from the sides of the branching conductive portion 310.

FIG. 17B illustrates a side surface 308 of the antenna 300 which includes a conductive structure 350. Like the conductive structure 150 of the antenna 100, the conductive structure 350 is a generally linear structure extending between the first and second major surfaces of the antenna 300. In some implementations, one or more conductive via through holes may be utilized instead of, or in addition to, the conductive section 350, and may provide conductivity between the conductive structures on the first major face 304 and the conductive structures on a second major surface 306.

FIG. 17C illustrates a first embodiment of a second major surface 306a of the antenna 300. The second major surface 306*a* is similar to the second major surface 206*a* of the antenna 200 of FIG. 16E, except that the second major surface 306*a* also includes a laterally extending conductive portion 314 opposite the laterally extending portion 332*a*. The laterally extending conductive portion 314 is connected to the laterally extending portion 332*a* by the longitudinally extending portion 334. As can be seen in the illustrated embodiment, the laterally extending portion 332*a* may be asymmetrically located relative to a centerline of the second major surface 306*a* of the antenna 300, such that it extends further outward from the longitudinally extending portion 334 in one direction than it does in the opposite direction.

The second major surface 306*a* can thus form a part of an antenna 300 which is similar to the antenna 100 except that the laterally extending portion 314 is on the second major surface of the antenna 300, in contrast to the laterally extending portion 114 of antenna 100 which is on the first major surface. Thus, in some embodiments, rather than being on the major surface of the antenna which is distal the PCB board to which the antenna is mounted, the laterally extending portion 314 can be on the major surface of the antenna which is proximal the PCB board to which the antenna 300 is mounted.

FIG. 17D illustrates a second embodiment of a second major surface 306*b* of the antenna 300. The second major surface 306*b* is similar to the second major surface 206*b* of the antenna 200 of FIG. 16F, except that the second major surface 306*b* also includes a laterally extending conductive portion 314 opposite the laterally extending portion 332*b*. The laterally extending conductive portion 314 is connected to the laterally extending portion 332*b* by the longitudinally extending portion 334. The laterally extending portion 332*b* has a varying longitudinal thickness along its length. In particular, the laterally extending portion 332*b* has a generally linear taper between the first thickness and the second thickness, giving a portion of the laterally extending portion 332*b* a frustopyramidal or V-shaped appearance.

FIG. 17E illustrates a third embodiment of a second major surface 306*c* of the antenna 300. The second major surface 306*c* is similar to the second major surface 206*c* of the antenna 200 of FIG. 16G, except that the second major surface 306*c* also includes a laterally extending conductive portion 314 opposite the laterally extending portion 332*c*. The laterally extending conductive portion 314 is connected to the laterally extending portion 332*c* by the longitudinally extending portion 334. The laterally extending portion 332*c* has a varying longitudinal thickness along its length. In particular, the laterally extending portion 332*c* has a non-linear taper between the first thickness and the second thickness, giving a portion of the laterally extending portion 332*c* a convex curved shape.

The exemplary shapes illustrated in FIGS. 17C to 17E are not an exhaustive list of all possible shapes for a second major surface of the antenna 300. Any other suitable shape may also be used. Any suitable combination of the side surfaces and second major surfaces may be used in an embodiment of the antenna 300.

FIG. 18A is a top view of a first major surface 404 of an antenna 400. The first major surface 404 includes a pronged or branching conductive portion 410 which, in the illustrated embodiment, is a generally U-shaped structure, in contrast to the V-shaped conductive structure of the antenna 100. In the illustrated embodiment, the outer boundaries of the branching conductive portion 410 are generally rounded along their entire length, while the interior boundary of the branching conductive portion 410 includes a combination of a curved section near the middle of the major surface 404 and linear sections closer to the edge of the major surface 404. However, any other combination of shapes may also be used to provide a branching conductive portion 410 which includes at least one curved outer or boundary.

The first major surface 404 also includes a laterally extending conductive portion 414 extending from the sides of the branching conductive portion 410 near the base or vertex of the branching conductive portion 410. The laterally extending conductive portion 414 may be asymmetrically arranged relative to the branching conductive portion 410 so that the laterally extending conductive portion 414 extends further outward from a first side of the branching conductive portion 410 than from the opposite side.

FIG. 18B illustrates a first embodiment of a side surface 408*a* which includes a conductive structure 450*a*. Like the conductive structure 250*a* of FIG. 16B, the conductive structure 450*a* is a generally linear structure extending between the first and second major surfaces of the antenna 400. In some implementations, one or more conductive via through holes may be utilized instead of, or in addition to, the conductive section 450, and may provide conductivity between the conductive structures on the first major face 404 and the conductive structures on a second major surface 406.

FIG. 18C illustrates a second embodiment of a side surface 408*b*. Like the conductive structure 250*b* of FIG. 16C, the conductive structure 450*b* does not have a substantially constant width along its height. A first portion 456*a* adjacent a first major surface of the antenna 400 is wider than a second portion 456*b* adjacent a second major surface of the antenna 400. In the embodiment illustrated in FIG. 18C, the first portion 456*a* has a substantially constant first width and the second portion 456*b* has a substantially constant second width, such that the conductive structure 450*b* is a generally T-shaped structure. In some embodiments, the wider first portion 456*a* can be adjacent the major surface of the antenna 400 which includes a laterally extending conductive structure, such as laterally extending conductive structure 414 extending along an edge adjacent the side surface 408*b*. As discussed herein, such a laterally extending conductive structure 414 may be asymmetrically arranged relative to a centerline of the major surface of the antenna 400 on which it is located.

FIG. 18D illustrates a third embodiment of a side surface 408*c*. Like the conductive structure 250*c* of FIG. 16D, the conductive structure 450*c* does not have a substantially constant width along its height. A first portion 456*a*' adjacent a first major surface of the antenna 400 has a tapering shape wider than a second portion 456*b*' adjacent a second major surface of the antenna 400. In the illustrated embodiment, the second portion 456*b*' has a generally constant second width along its height, and the first portion 456*a*' has a frustopyramidal shape extending from the smaller second width adjacent the second portion 456*b*' to a first wider width at the edge of the side surface 408*c*.

The exemplary shapes illustrated in FIGS. 18B to 18D are not an exhaustive list of all possible shapes. As discussed with respect to FIGS. 16B to 16D, some embodiments in which the conductive structure has a tapering width, the taper may not be linear, but may instead be curved. In some embodiments, all or substantially all of the conductive structure may have a frustopyramidal shape. Any other suitable shape may also be used.

FIG. 18E illustrates an embodiment of a second major surface 406*a*. Like the second major surface 206*a* of FIG. 16E, the second major surface 406*a* includes a branching conductive structure 430*a* which in the illustrated embodiment is a generally T-shaped structure, including a laterally extending portion 432a extending along or adjacent an edge of the second major face 406a of the antenna 400, and a longitudinally extending portion 434 extending between the laterally extending portion 432a and the opposite edge. The longitudinally extending portion 434 runs generally perpendicular to the laterally extending portion 432b at or near a centerline of the bottom second major face 406a of the antenna 400. In the illustrated embodiment, the longitudinally extending portion 434 has a substantially constant width. The longitudinal thickness of the laterally extending portion 432a is substantially constant across the laterally extending portion 432a, giving the branching conductive structure 430a a T-shape. The second major surface 406a may also include conductive pads 458 aligned with the solder locations 168 on a PCB 160 to which the antenna 400 will be attached.

FIG. 18F illustrates a second embodiment of a second major surface 406b. Like the second major surface 206b of FIG. 16F, the second major surface 406b includes a branching conductive structure 430b which includes a laterally extending portion 432b extending along or adjacent an edge of the second major face 406b of the antenna 400, and a longitudinally extending portion 434 extending in a generally perpendicular direction between the laterally extending portion 432b and the opposite edge. In contrast to the laterally extending portion 432b of the branching conductive structure 430a, the laterally extending portion 432b of the branching conductive structure 430b does not have a substantially constant longitudinal thickness. Instead, the longitudinal thickness of the laterally extending portion 432b decreases from a first thickness adjacent the laterally extending portion 432b to a second thickness at the side edges of the second major surface 406b. In the illustrated embodiment, the laterally extending portion 432b has a generally linear taper between the first thickness and the second thickness, giving a portion of the laterally extending portion 432b a frustopyramidal or V-shaped appearance.

FIG. 18G illustrates a second embodiment of a second major surface 406b. Like the second major surface 206c of FIG. 16G, the second major surface 406c includes a branching conductive structure 430b which includes a laterally extending portion 432b extending along or adjacent an edge of the second major face 406b of the antenna 400, and a longitudinally extending portion 434 extending in a generally perpendicular direction between the laterally extending portion 432b and the opposite edge, where the laterally extending portion 432b has a varying longitudinal thickness. However, unlike the branching conductive structure 430b, the variance between the maximum longitudinal thickness and the minimum longitudinal thickness is not linear. Instead, the rate of taper increases with increased distance from the longitudinally extending portion 434. The varying rate of taper of the illustrated embodiment gives a portion of the laterally extending portion 432c adjacent the longitudinally extending portion 434 a convex curved shape.

The exemplary shapes illustrated in FIGS. 18E to 18G are not an exhaustive list of all possible shapes for a second major surface of the antenna 400. As discussed with respect to FIGS. 16E to 16G, any other suitable shape may also be used. Any suitable combination of the side surfaces and second major surfaces may be used in an embodiment of the antenna 400.

FIGS. 19A to 19E illustrate various views of various alternative embodiments of another alternative antenna design. FIG. 19A illustrates a first major surface 504 of the antenna 500 which includes a pronged or branching conductive portion 510 and which, in the illustrated embodiment, is a generally U-shaped structure, like the U-shaped conductive structure of the antenna 400 of FIG. 18A. However, the first major surface 504 differs from the first major surface 404 of the antenna 400 in that the first major surface 504 does not include a laterally extending conductive portion extending outward from the sides of the branching conductive portion 510.

FIG. 19B illustrates a side surface 508 of the antenna 500 which includes a conductive structure 550. Like the conductive structure 150 of the antenna 100, the conductive structure 550 is a generally linear structure extending between the first and second major surfaces of the antenna 500. In some implementations, one or more conductive via through holes may be utilized instead of, or in addition to, the conductive section 550, and may provide conductivity between the conductive structures on the first major face 504 and the conductive structures on a second major surface 506.

FIG. 19C illustrates a first embodiment of a second major surface 506a of the antenna 500. The second major surface 506a is similar to the second major surface 306a of the antenna 300 of FIG. 17E, as the second major surface 506a also includes a laterally extending conductive portion 514 opposite the laterally extending portion 532a. The laterally extending conductive portion 514 is connected to the laterally extending portion 532a by the longitudinally extending portion 534. As can be seen in the illustrated embodiment, the laterally extending portion 532a may be asymmetrically located relative to a centerline of the second major surface 506a of the antenna 500, such that it extends further outward from the longitudinally extending portion 534 in one direction than it does in the opposite direction.

The second major surface 506a can thus form a part of an antenna 500 in which the laterally extending portion 514 is on the second major surface of the antenna 500. Thus, in some embodiments, rather than being on the major surface of the antenna which is distal the PCB board to which the antenna is mounted, the laterally extending portion 514 can be on the major surface of the antenna which is proximal the PCB board to which the antenna 500 is mounted.

FIG. 19D illustrates a second embodiment of a second major surface 506b of the antenna 500. The second major surface 506b is similar to the second major surface 306b of the antenna 300 of FIG. 17D, as the second major surface 506b also includes a laterally extending conductive portion 514 opposite the laterally extending portion 532b. The laterally extending conductive portion 514 is connected to the laterally extending portion 532b by the longitudinally extending portion 534. The laterally extending portion 532b has a varying longitudinal thickness along its length. In particular, the laterally extending portion 532b has a generally linear taper between the first thickness and the second thickness, giving a portion of the laterally extending portion 532b a frustopyramidal or V-shaped appearance.

FIG. 19E illustrates a third embodiment of a second major surface 506c of the antenna 500. The second major surface 506c is similar to the second major surface 306c of the antenna 300 of FIG. 17E, as the second major surface 506c also includes a laterally extending conductive portion 514 opposite the laterally extending portion 532c. The laterally extending conductive portion 514 is connected to the laterally extending portion 532c by the longitudinally extending portion 534. The laterally extending portion 532c has a varying longitudinal thickness along its length. In particular, the laterally extending portion 532c has a nonlinear taper between the first thickness and the second thickness, giving a portion of the laterally extending portion 532c a convex curved shape.

The exemplary shapes illustrated in FIGS. 19C to 19E represent only a subset of possible shapes for a second major surface of the antenna 500. Any other suitable shape may also be used. Any suitable combination of the side surfaces and second major surfaces may be used in an embodiment of the antenna 500.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to aspects of the present disclosure, other and further aspects of the disclosure may be devised without departing from the basic scope thereof, and the scope thereof is determined by the claims that follow.

What is claimed is:

1. An antenna structure, comprising:
    a substrate comprising a top major face, a bottom major face, and a side face, the top major face comprising:
        a first edge of the top major face being disposed adjacent the side face and a second edge of the top major face being disposed opposite from the first edge of the top major face;
        a first laterally extending conductive structure extending at least partially along the first edge of the top major face of the substrate; and
        a pronged conductive structure comprising a first prong extending from a central portion of the first laterally extending conductive structure towards a first corner of the top major face of the substrate adjacent the second edge of the top major face, and a second prong extending from the central portion of the first laterally extending conductive structure towards a second corner of the top major face of the substrate adjacent the second edge of the top major face, the second corner of the top major face residing opposite from the first corner of the top major face of the substrate along the second edge of the top major face;
    the bottom major face comprising:
        a second laterally extending conductive structure extending along a first edge of the bottom major face of the substrate; and
        a longitudinally extending conductive structure extending between the second laterally extending conductive structure towards a second edge of the bottom major face of the substrate opposite the first edge of the bottom major face of the substrate; and
    a conductive structure aligned with the longitudinally extending conductive structure of the bottom major face, the conductive structure placing the conductive structures on the top major face in electrical communication with the conductive structures on the bottom major face.

2. The antenna structure of claim 1, wherein the first laterally extending conductive structure is asymmetrically aligned relative to the pronged conductive structure.

3. The antenna structure of claim 2, wherein a first portion of the first laterally extending structure extending from a first side of the pronged conductive structure is longer than a second portion of the first laterally extending conductive structure extending from a second side of the pronged conductive structure.

4. The antenna structure of claim 3, wherein the pronged conductive structure comprises a substantially V-shaped structure.

5. The antenna structure of claim 3, wherein the pronged conductive structure comprises a substantially U-shaped structure.

6. The antenna structure of claim 1, wherein a width of the first prong increases with increased distance from the first laterally extending conductive structure, and wherein a width of the second prong increases with increased distance from the first laterally extending conductive structure.

7. The antenna structure of claim 6, wherein the first laterally extending conductive structure extends along only a portion of the first edge of the top major face of the substrate.

8. The antenna structure of claim 7, wherein the top major face and the bottom major face have dimensions of roughly 10 mm by 20 mm.

9. The antenna structure of claim 8, wherein the side face has dimensions of roughly 3 mm by 20 mm.

10. An antenna assembly comprising:
    a printed circuit board comprising:
        a feed line;
        a ground plane; and
        an impedance matching component in electrical communication between the feed line and the ground plane; and
    a surface mount antenna mounted to the printed circuit board, the surface mount antenna comprising:
        a substrate;
        a conductive structure on a top major surface of the substrate distal the printed circuit board, the conductive structure comprising:
            a laterally extending portion extending along a first edge of the top major surface proximal the feed line;
            a first prong extending away from the laterally extending portion at a first oblique angle to the laterally extending portion; and
            a second prong extending away from the laterally extending portion at a second oblique angle to the laterally extending portion;
            wherein a width of the first prong increases with increased distance from the laterally extending portion, and wherein a width of the second prong increases with increased distance from the laterally extending portion.

11. The antenna assembly of claim 10, wherein the first and second prong form a substantially V-shaped structure.

12. The antenna assembly of claim 11, wherein the laterally extending portion is asymmetrically arranged relative to the first and second prongs.

13. The antenna assembly of claim 10, wherein the first and second prong form a substantially U-shaped structure.

14. The antenna assembly of claim 10, wherein the printed circuit board comprises a ground layer on a side of the printed circuit board opposite the ground plane, and a plurality of vias extending through the printed circuit board and electrically connecting the ground plane to the ground layer.

15. The antenna assembly of claim 14, wherein the printed circuit board has a length of between 30 mm and 65 mm.

16. The antenna assembly of claim 15, wherein the printed circuit board has a length of between 40 and 45 mm.

17. The antenna assembly of claim 10, wherein the surface mount antenna comprises a substantially T-shaped conductive structure on a bottom major surface of the surface mount antenna that is disposed proximate the printed circuit board.

18. The antenna assembly of claim 17, wherein the surface mount antenna comprises a conductive structure on a side surface of the surface mount antenna, the conductive structure on the side surface placing the conductive structure on the top major surface in electrical communication with the substantially T-shaped conductive structure on the bottom major surface.

19. The antenna assembly of claim 18, wherein the laterally extending portion extends along only a portion of the first edge of the top major face of the substrate.

20. The antenna assembly of claim 19, wherein the substrate has dimensions of roughly 20 mm×10 mm×3 mm.

* * * * *